US008614568B2

(12) United States Patent
Uruno et al.

(10) Patent No.: US 8,614,568 B2
(45) Date of Patent: Dec. 24, 2013

(54) GATE DRIVE CIRCUIT OF THE VOLTAGE DRIVE TYPE SEMICONDUCTOR ELEMENT AND POWER CONVERTER

(75) Inventors: Junpei Uruno, Tokai (JP); Hiroyuki Shoji, Hitachi (JP); Masayuki Isogai, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 373 days.

(21) Appl. No.: 13/028,675

(22) Filed: Feb. 16, 2011

(65) Prior Publication Data

US 2011/0228564 A1 Sep. 22, 2011

(30) Foreign Application Priority Data

Mar. 17, 2010 (JP) ................................. 2010-060101

(51) Int. Cl.
G05F 1/10 (2006.01)
(52) U.S. Cl.
USPC .......................................... 323/271; 323/282
(58) Field of Classification Search
USPC ................. 323/127, 268, 271, 274, 276, 282; 363/17, 21.14
See application file for complete search history.

(56) References Cited

U.S. PATENT DOCUMENTS

| 5,453,923 | A | * | 9/1995 | Scalais et al. | .................... 363/53 |
| 5,877,947 | A | * | 3/1999 | Chen et al. | ...................... 363/53 |
| 7,245,509 | B1 | * | 7/2007 | Chan et al. | ....................... 363/17 |
| 7,688,133 | B2 | * | 3/2010 | Yamamoto et al. | ............. 330/51 |
| 7,737,737 | B2 | * | 6/2010 | Higashi et al. | ................. 327/112 |
| 7,973,494 | B2 | * | 7/2011 | Yao et al. | ....................... 315/291 |
| 2011/0228564 | A1 | * | 9/2011 | Uruno et al. | ..................... 363/17 |

FOREIGN PATENT DOCUMENTS

| JP | 62-147953 | 7/1987 |
| JP | 2007-336694 | 12/2007 |
| JP | 2009-021823 | 1/2009 |
| JP | 2010-35377 | 2/2010 |

OTHER PUBLICATIONS

Machine translation of JP 2010-035377, cited on IDS filed May 15, 2012.*
Office Action in JP 2010-060101, issued Feb. 24, 2012, (in Japanese, 2 pgs.), (English language translation, 3 pgs.).

* cited by examiner

Primary Examiner — Adolf Berhane
Assistant Examiner — Yemane Mehari
(74) Attorney, Agent, or Firm — Antonelli, Terry, Stout & Kraus, LLP.

(57) ABSTRACT

A power converting apparatus having a gate drive circuit including a push-pull circuit consisting of two transistors at its output stage; a diode connected in series with the push-pull circuit; a gate power source connected in parallel with the series circuit of the push-pull circuit and the diode; a negative voltage generating circuit connected in parallel with the push-pull circuit; a transistor connected between the output terminal of the negative voltage generating circuit and the negative terminal of the gate power source, wherein the output voltage of the push-pull circuit is switched from positive polarity to negative polarity and vice versa depending on the signal applied to the base terminals of the transistors.

17 Claims, 18 Drawing Sheets

GATE DRIVE CIRCUIT OF THE VOLTAGE DRIVE TYPE SEMICONDUCTOR ELEMENT AND POWER CONVERTER

BACKGROUND OF THE INVENTION

This invention relates to a gate drive circuit used for the voltage-driven semiconductor elements used in a power converter and to a power converting apparatus.

In a power converting apparatus such as an inverter or a converter which uses switching elements of voltage-driven type including insulated gate bipolar transistors (IGBTs) or power MOSFETs, electric energy is transferred from the input side to the output side by supplying and interrupting the voltage applied between the emitter and the gate of each switching element, e.g. IGBT. When the switching element is turned on or off, switching loss is incurred. This switching loss can be reduced by enhancing the gating drive efficiency and switching over between the conductive and cut-off states of the switching element swiftly. On the other hand, if the collector voltage of the IGBT (in the cut-off state) rises steeply due to the swift switching of the IGBT, the gate-emitter capacitance Cge is charged through the gate-collector capacitance Cgc. Consequently, the gate voltage is elevated, and if it exceeds a threshold, the IGBT fires erroneously. In order to reduce the switching loss due to the increase in switching speed and to prevent erroneous firing, a negative voltage is usually applied to the gate of the IGBT so as to prevent the gate voltage from rising due to the swift withdrawal of gate charges and the increase in the time rate of change dv/dt of the collector voltage.

JP-A-2009-21823 discloses a gate drive circuit which can apply a negative voltage to the gate of a semiconductor element by using a single power supply. The circuit configuration of the gate drive circuit, as shown in FIG. 1 attached to the disclosure, comprises a DC power supply Vdd, five switches SW1~SW5, and a capacitor Cin. One terminal of the switch SW1 is connected with the positive terminal of the power supply Vdd; the switch SW2 is connected between the other terminal of the switch SW1 and the negative terminal of the power supply Vdd; one terminal of the switch SW3 is connected with the positive terminal of the power supply Vdd; the switch SW4 is connected between the other terminal of the switch SW3 and the switch SW5; the switch SW5 is connected between the other terminal of the switch SW4 and the negative terminal of the power supply Vdd; the capacitor Cin is connected between the other terminal of the switch SW1 and the other terminal of the switch SW4; the other terminal of the switch SW3 is connected with the gate of the power MOSFET; and the source of the power MOSFET is connected with the negative terminal of the power supply Vdd.

The operation of this circuit is described below. With SW1, SW3 and SW5 closed and with SW2 and SW 4 open, the gate voltage of the power MOSFET is elevated up to Vdd via SW3. On the other hand, the capacitor Cin is charged up to Vdd through a path consisting of SW1, Cin and SW5. Then, when SW1, SW3 and SW5 are opened and when SW2 and SW4 are closed, the gate of the power MOSFET is kept at a negative voltage (−Vdd) through a path consisting of SW4, Cin and SW2. In this way, a positive voltage and a negative voltage are applied in turn so that high speed turn-off can be effectuated and that erroneous firing can be prevented.

JP-A-2007-336694 discloses a gate drive circuit which can apply a negative voltage to the gate of an insulated gate type semiconductor device by using a single DC power source. The circuit configuration of the gate drive circuit, as shown in FIG. 1 attached to the disclosure, is as follows. A series circuit of transistors Q1 and Q2 is connected between the positive and negative electrodes of the DC power source VD; one end of a parallel circuit of a resistor R1 and a capacitor C1 is connected to the junction point of the transistors Q1 and Q2; one end of a gate resistor RG is connected to the other end of the parallel circuit; and the other end of the gate resistor RG is connected with the gate of the insulated gate type semiconductor element. A series circuit of a zener diode ZD1 and a reverse-flow preventing diode D1 is connected between the gate and the emitter of the insulated gate type semiconductor element PT. The operation of this circuit is as follows. When Q1 is turned on and Q2 is turned off, C1 functions as a differentiating circuit immediately after the turn-on of Q1. Accordingly, spike current flows through a path consisting of C1, RG and the gate-emitter capacitance of PT. A voltage clamped by ZD1 is applied to the gate of PT. While PT is conductive, the clamped voltage is equal to VD−VC1, VC1 being the voltage developed across C1. Then, when Q1 is turned off and Q2 is turned on, C1 is charged to develop a voltage of VD−Vz. As a result, a negative voltage is applied to the gate of PT. Hence, high speed turn-off can be effectuated and turn-off loss can also be reduced.

SUMMARY OF THE INVENTION

However, with the gate drive circuit disclosed in JP-A-2009-21823, since the negative gate voltage becomes equal to −Vdd, the turn-on of the insulated gate semiconductor element is retarded. This leads to a problem that the turn-on loss increases. Also, in the case where a SiC-JFET is used which has different gate withstand voltages depending on whether the applied gate voltage is positive or negative, the gate drive circuit as disclose in JP-A-2009-21823 cannot be used. This is another problem inherent with this gate drive circuit.

In JP-A-2007-336694, there is proposed a means for applying a negative voltage whose absolute value is smaller than Vdd, to the gate of a semiconductor element. However, since the gate voltage applied at turn-on instant becomes lower than Vdd, a problem still arises that the turn-on resistance increases and the conduction loss also increases.

The object of this invention, which has been made to solve the above mentioned problems, is to provide a gate drive circuit which can apply a negative voltage between the gate and the emitter of a semiconductor element by using a simple circuit configuration, whereby switching loss can be reduced and also erroneous firing can be prevented.

In order to solve the above mentioned problems, there is provided, according to a first embodiment of this invention, a gate drive circuit for driving the voltage-driven semiconductor elements used in a power converter or a voltage-driven semiconductor element, comprising a gate power source; a push-pull circuit consisting of a NPN transistor and a first PNP transistor connected in series; a series circuit of the push-pull circuit and a diode connected between the positive and negative electrodes of the gate power source; a negative voltage generating circuit connected between the positive electrode of the gate power source and a connecting point of the push-pull circuit (10) and the diode; and a second PNP transistor connected between the output terminal of the negative voltage generating circuit and the negative electrode of the gate power source, wherein the junction point of the NPN transistor and the first PNP transistor is connected with the gate terminal of the voltage-driven semiconductor element via a gate resistor; and the emitter terminal of the voltage-driven semiconductor element is connected with the negative electrode of the gate power source.

According to a second embodiment of this invention, there is provided a power converting apparatus comprising an AC power source; a rectifying circuit for rectifying the output of the AC power source; a converter for converting the output of the rectifying circuit to DC voltage; a first gate drive circuit for driving the converter; an inverter for inverting the output of the converter to AC voltage; a second gate drive circuit for driving the inverter; and a load for receiving the output of the inverter, wherein each of the first and second gate drive circuits has the same circuit configuration as that of the gate drive circuit according to the first embodiment described above.

According to this invention, since the gate of the voltage-driven semiconductor element can be maintained at a negative voltage whose absolute value is smaller than the voltage of a single DC power source used in the gate drive circuit, the swift switching of the voltage-driven semiconductor element can be effectuated and also the erroneous firing of the voltage-driven semiconductor element can be prevented, without increasing the cost and size of and the loss in, the gate drive circuit.

Other objects, features and advantages of the invention will become apparent from the following description of the embodiments of the invention taken in conjunction with the accompanying drawings.

DESCRIPTION OF THE EMBODIMENTS

Embodiments of this invention will be described below with reference to the attached drawings.

[Embodiment 1]

A gate drive circuit as the first embodiment of this invention will be described with reference to FIG. 1.

Figure 1:
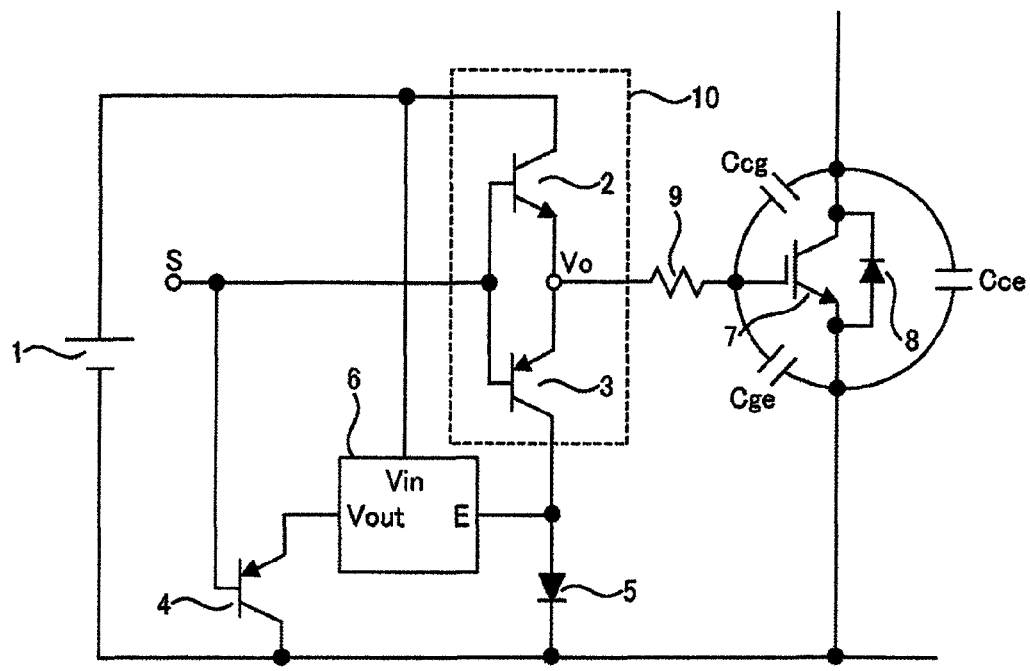
FIG. 1 is a circuit configuration of a gate drive circuit as the first embodiment of this invention.

In FIG. 1, reference numeral 1 designates a gate power source; 10 a push-pull circuit provided at the output stage of a gate drive circuit, consisting of an NPN transistor 2 and a PNP transistor 3; 4 a PNP transistor; 5 a diode; 6 a negative voltage generating circuit; 7 an IGBT; 8 a freewheeling diode; and 9 a gate resistor.

Now, the interconnection among the circuit components will be described. The positive electrode of the gate power source 1 is connected with the Vin terminal of the negative voltage generating circuit 6 and the collector terminal of the NPN transistor 2 of the push-pull circuit 10. The emitter terminal of the NPN transistor 2 is connected with the emitter terminal of the PNP transistor 3. The collector terminal of the PNP transistor 3 is connected with the anode of the diode 5 and the E terminal (a common reference terminal) of the negative voltage generating circuit 6. The junction point Vo between the NPN transistor 2 and the PNP transistor 3 is connected with the gate terminal of the IGBT 7 via the gate resistor 9. The emitter terminal of the PNP transistor 4 is connected with the Vout terminal of the negative voltage generating circuit 6. The base terminals of the transistors 2, 3 and 4 are all connected with a drive signal input terminal S. The collector terminal of the PNP transistor 4, the cathode of the diode 5, and the emitter terminal of the IGBT 7 are all connected with the negative electrode of the gate power source 1.

Next, the operation of this gate drive circuit will be described. When a turn-on signal is applied to the drive signal input terminal S (hereafter referred to as S terminal), the NPN transistor 2 is turned on while the PNP transistors 3 and 4 remain turned off. Then, current flows from the gate power source 1 to the gate capacitance of the IGBT 7 via the NPN transistor 2 and the gate resistor 9. Consequently, the voltage at the gate terminal of the IGBT 7 rises.

On the other hand, if a turn-off signal is applied to the S terminal, the NPN transistor 2 is turned off and the PNP transistors 3 and 4 are turned on. As a result, current flows through a path consisting of the gate capacitance of the IGBT 7, the gate resistor 9, the PNP transistor 3, the negative voltage generating circuit 6, and the PNP transistor 4. Therefore, the negative voltage generating circuit 6 causes a negative voltage to be applied between the gate and emitter terminals of the IGBT 7 so that the gate capacitance of the IGBT 7 is swiftly discharged. This enables the IGBT 7 to turn off swiftly. It should be noted here that the negative voltage generating circuit 6 can be easily realized by using a three-terminal voltage regulator. Available are various three-terminal voltage regulators having different output voltages, and a suitable one may be selected depending on the desired negative voltage.

In the first embodiment described above, NPN and PNP transistors are used to constitute a gate drive circuit, but it is needless to say that MOSFETs can be used for the same purpose and effect. In other words, the PNP transistors may be substituted by p-type MOSFETs, and the NPN transistor by a n-type MOSFET. MOSFETs are voltage-driven type transistors and therefore their driving powers can be smaller than those of PNP and NPN transistors. Also, the switching speeds of the MOSFETs are very fast and therefore suitable for high frequency application.

[Embodiment 2]

Figure 2:
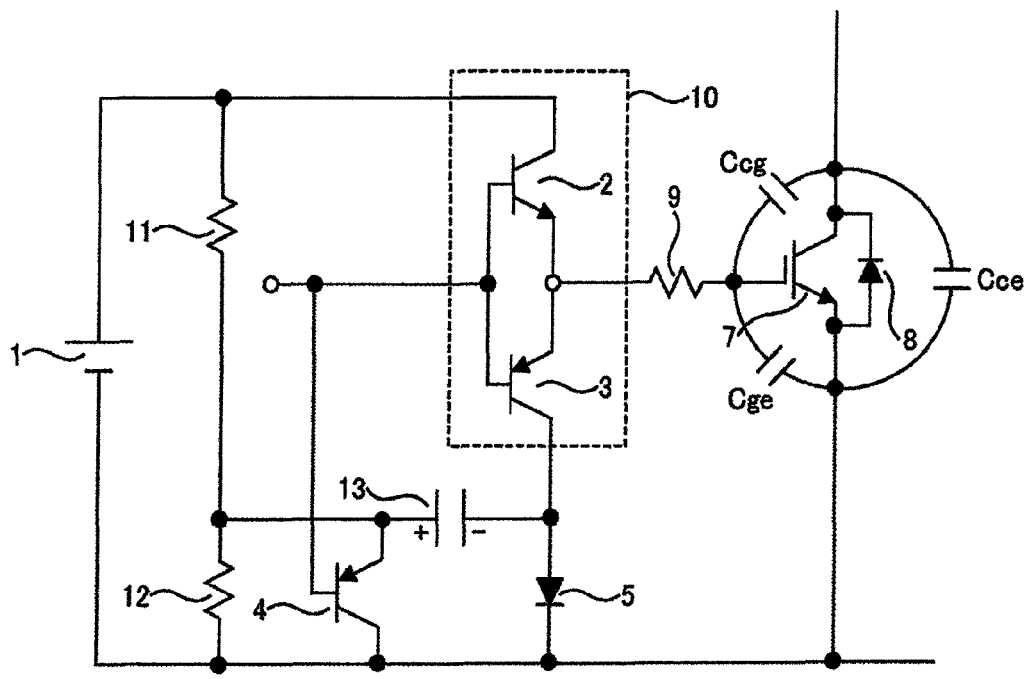
FIG. 2 is a circuit configuration of a gate drive circuit as the second embodiment of this invention.

The second embodiment of this invention will be described with reference to FIG. 2. In FIG. 2, circuit constituents equivalent to those shown in FIG. 1 are designated by like reference numerals, and duplicate explanation is omitted in the specification. The second embodiment differs from the first embodiment in that the negative voltage generating circuit 6 is made up of a resistors 11 and 12, and a capacitor 13.

The operation of the gate drive circuit as the second embodiment of this invention will be described below. When the IGBT 7 is turned on, the ensuing operation is the same with the first embodiment described above and therefore the description of operation is omitted. The capacitor 13 is charged in the following way: when a turn-on signal is applied to the S terminal, the PNP transistors 3 and 4 remain cut off; the voltage from the gate power source 1 is applied to the gate terminal of the IGBT 7 via the NPN transistor 2 while current flows through a path consisting of the resistors 11 and 12 and a path consisting of the resistor 11, the capacitor 13 and the diode 5; and the capacitor is charged to developed across it a voltage $Vc_{13}$ equal to the voltage $Vr_{12}$ obtained by dividing the voltage of the gate power source 1 in accordance with the resistance ratio of the resistors 11 and 12, minus the forward voltage drop VF of the diode 5, that is, $Vc_{13}=Vr_{12}-VF$.

The values of the resistors 11 and 12, and the capacitor 13 are selected in the following way. The capacitance of the capacitor 13 must be chosen sufficiently larger than the gate-emitter capacitance of the IGBT 7. No problem will arise if the former is about 10 times as large as the latter. As to the value of the resistor 11, it must be selected on the basis of the capacitance of the capacitor 13 and the conduction time (i.e. turn-on time) of the IGBT 7. In fact, since the value of the resistor 11 is determined depending on the CR time constant related to the resistor 11 and the capacitor 13, this embodiment is suitable for the operation in which the conduction time of the IGBT 7 does not fluctuate so much. The value of the resistor 12 is determined so that the difference VF between the divided voltage obtained due to the resistors 11 and 12, and the forward voltage drop of the diode 5 can charge the capacitor 13 to develop a required negative voltage.

[Embodiment 3]

Figure 3:
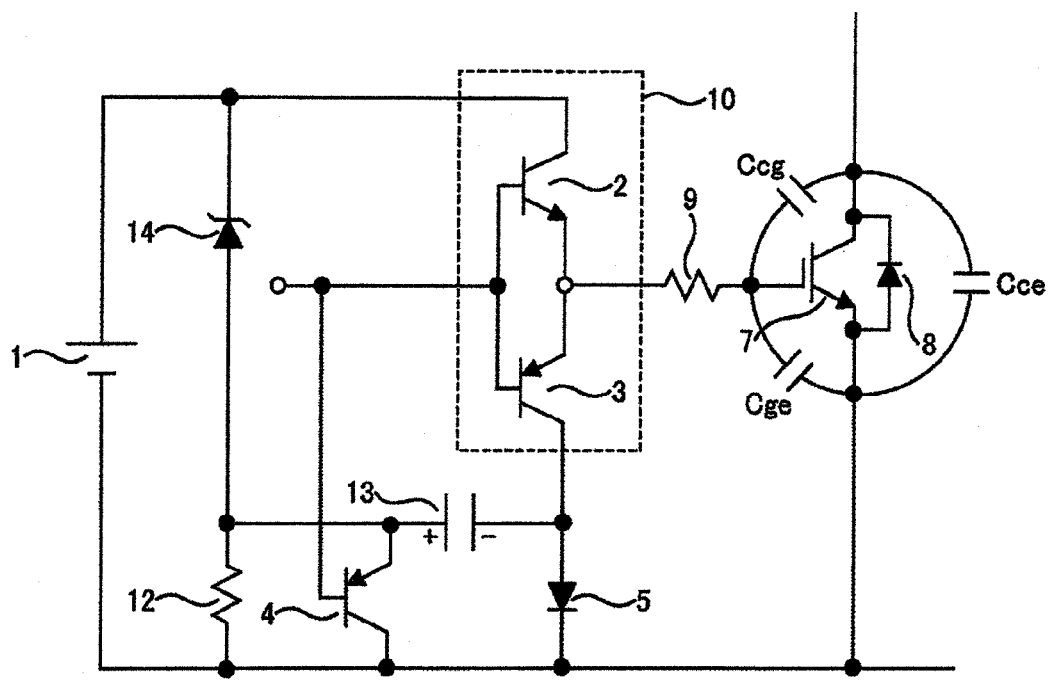
FIG. 3 is a circuit configuration of a gate drive circuit as the third embodiment of this invention.

The third embodiment of this invention will now be described with reference to FIG. 3. In FIG. 3, circuit components equivalent to those shown in FIG. 2 are designated by like reference numerals, and duplicate explanation is omitted in the specification. The third embodiment differs from the second embodiment in that a zener diode 14 is substituted for the resistor 11. In fact, a series circuit of the zener diode 14 and the resistor 12 is connected across the gate power source 1, and the junction point between the zener diode 14 and the resistor 12 is connected with the capacitor 13 and the emitter terminal of the PNP transistor 4.

In this embodiment, the above-mentioned negative voltage is equal to the voltage of the gate power source 1 minus the zener breakdown voltage of the zener diode 14 and the forward voltage drop VF of the diode 5. Since the forward voltage drop VF of the diode 5 is usually 0.6 V, the value of the negative voltage can be arbitrarily selected by using a zener diode having a desired breakdown voltage. When the zener diode 14 breaks down, current flows instantaneously so that the capacitor 13 can be charged swiftly. Accordingly, with this gate drive circuit, a negative voltage for turn-off can be supplied to the IGBT 7 even in the operation in which the conduction time of the IGBT 7 fluctuates. As to the capacitance of the capacitor 13, the same is true of the second embodiment described above.

[Embodiment 4]

Figure 4:
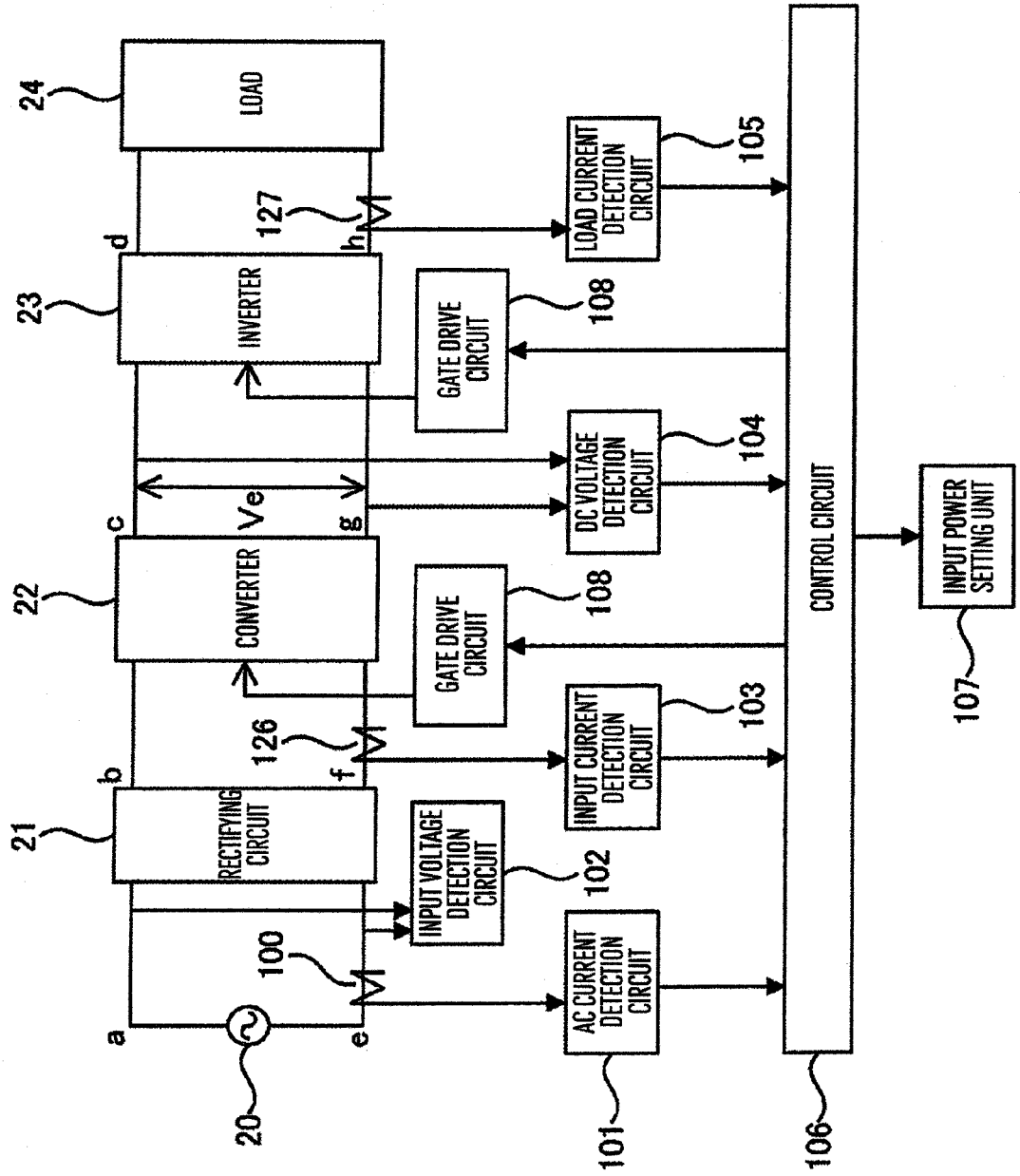
FIG. 4 shows in block diagram the circuit of a power conversion apparatus as the fourth embodiment of this invention.

The fourth embodiment of this invention will now be described with reference to FIG. 4. FIG. 4 shows in block diagram the circuit of a power conversion apparatus. The power conversion apparatus rectifies the voltage supplied from the commercial AC source 20 by means of a rectifying circuit 21 and then changes the rectified voltage to a DC voltage by means of a converter 22. Further, the output voltage of the converter 22 is changed into alternating current by means of an inverter 23, and the alternating current is fed to a load 24.

Description is made of the converter 22. Known is the method of controlling converters called "power factor correction control (PFC control)". In general, power conversion apparatuses for which the commercial power system supplies power, use the PFC control to suppress the current of higher harmonics and to prevent the operation failures of related machines and devices, the burnout of power facility, and the generation of noise.

Description is made of the detection circuits and the control circuits which the PFC control requires. In order to measure the power supplied from the commercial power source 20, the AC current flowing out of the commercial power source 20 must be detected. In this embodiment, the AC current flowing out of the commercial power source 20 is first changed into a voltage by a current sensor 100, and then the voltage is detected by an AC current detection circuit 101. Alternatively, the current flowing into the converter 22 may first be changed into a voltage by a current sensor 126, and then the voltage may be detected by an input current detection circuit 103. In order to measure the power supplied to the load 24, the current flowing into the load must be detected. For this purpose, the load current is changed into a voltage by a current sensor 127, and the voltage is detected by a load current detection circuit 105.

In the control in which power factor is improved by shaping the sinusoidal current whose phase is in synchronism with that of the voltage of the commercial power source 20, the output voltage of the rectifying circuit 21, i.e. rectified DC voltage serving as the reference signal for the AC current waveform, is detected by an input voltage detection circuit 102. Further, in order to control the output voltage so that it can become constant, the voltage Ve across the output terminals of the converter 22 that serves as a step-up circuit, is detected by a DC voltage detection circuit 104. It is noted here that in order to reduce the number of circuit components, the input voltage detection circuit 102 may be omitted, and instead a reference signal that can be substituted for the input voltage may be obtained so that the waveform of the AC current flowing out of the commercial power source 20 is shaped.

Then, description is made of the control according to this embodiment. Here is performed the PFC control in which the waveform of the input current is shaped into that of sinusoidal current in accordance with the voltage of the commercial power source 20 so that the input voltage waveform can be in synchronism with the sinusoidal current waveform. The PFC control is described in detail below with reference to FIG. 5.

Figure 5:
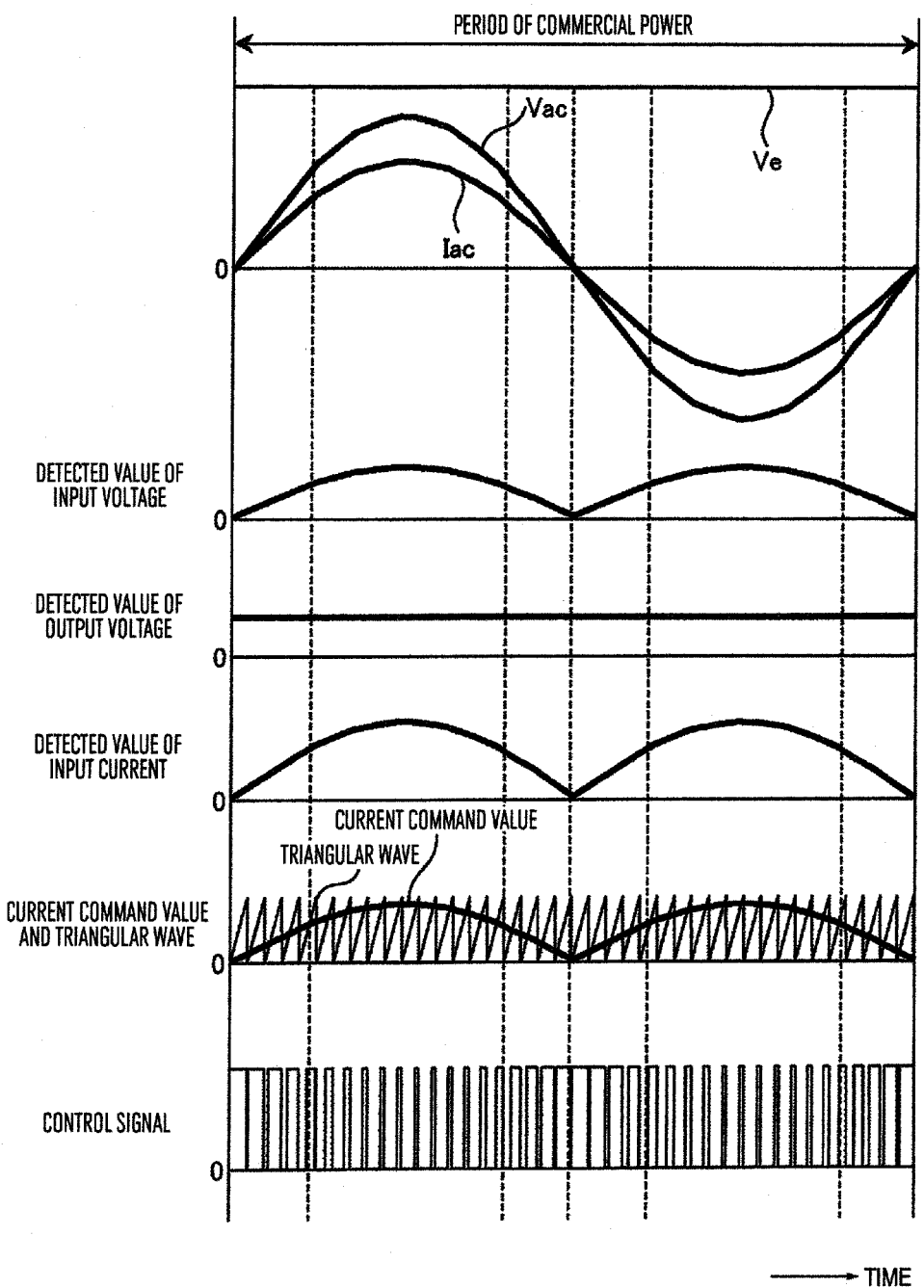
FIG. 5 illustrates a method of controlling a converter used in the fourth embodiment of this invention and the waveforms relating to the operation of the converter.

FIG. 5 graphically shows the voltage waveform Vac and the current waveform Iac of the commercial AC power source 20 during one period; and the waveforms of the output voltage Ve of the converter 22, the detected value of the input voltage, the detected value of the output voltage, the detected value of the input current, the current command value and the triangular wave, and the control signal, all associated with the converter 22.

First, as shown in FIG. 5, the output voltage Ve is set higher than the peak value of the voltage waveform Vac.

Then, description is made of how the current command value is generated. The detected value of the input voltage is multiplied by the detected value of the output voltage. The difference between the result of the multiplication and the detected value of the input current is amplified to generate the current command value. The control signal is generated by comparing the current command value with the triangular wave. In other words, when the current command value is larger than the triangular wave, the control signal is rendered off, whereas the control signal is rendered on when the current command value is smaller than the triangular wave. This control signal is delivered via the gate drive circuit 108 and drives the converter 22.

By using such a gate drive circuit described in one of the embodiments 1 through 3 for the gate drive circuit 108 for this PFC control circuit (converter 22 in FIG. 4), switching speed can be increased so that the switching loss can be reduced and that the erroneous firing of switching elements can be prevented.

[Embodiment 5]

Figure 6:
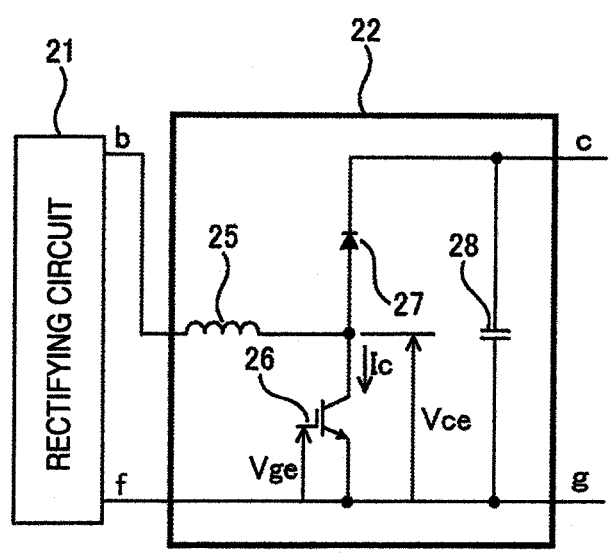
FIG. 6 is the circuit configuration of a converter as the fifth embodiment of this invention.

The fifth embodiment of this invention will now be described with reference to FIG. 6. FIG. 6 shows a concrete example of the circuit of the converter 22 described above in the fourth embodiment. This converter 22 uses a chopper circuit, including a choke coil 25, an IGBT 26, a diode 27 and a smoothing capacitor 28.

The circuit configuration in FIG. 6 will then be described. The positive output terminal b of the rectifying circuit 21 is connected with the collector terminal of the IGBT 26 and the anode of the diode 27 via the choke coil 25. The emitter terminal of the IGBT 26 is connected with the negative output terminal f of the rectifying circuit 21. The cathode of the diode 27 is connected with the positive terminal of the smoothing capacitor 28. The negative terminal of the smoothing capacitor 28 is connected with the negative output terminal f of the rectifying circuit 21.

Now, the operation of the converter 22 will be described. When the IGBT 26 is turned on, current flows from the rectifying circuit 21 through the choke coil 21 and the IGBT 26 so that electromagnetic energy is stored in the choke coil 25. When the IGBT 26 is turned off thereafter, the energy stored in the choke coil 25 is released in the form of current and flows through the choke coil 25, the diode 27, the smoothing capacitor 28 and the rectifying circuit 21 so that the smoothing capacitor 28 is charged with electrostatic energy. As a result of the repetition of this operation, the energy supplied from the commercial AC power source 20 is stored in the smoothing capacitor 28 and further transferred as energy having voltage higher than the input voltage, to an inverter connected at the after the smoothing capacitor 28 and to a load (not shown).

Figure 7:
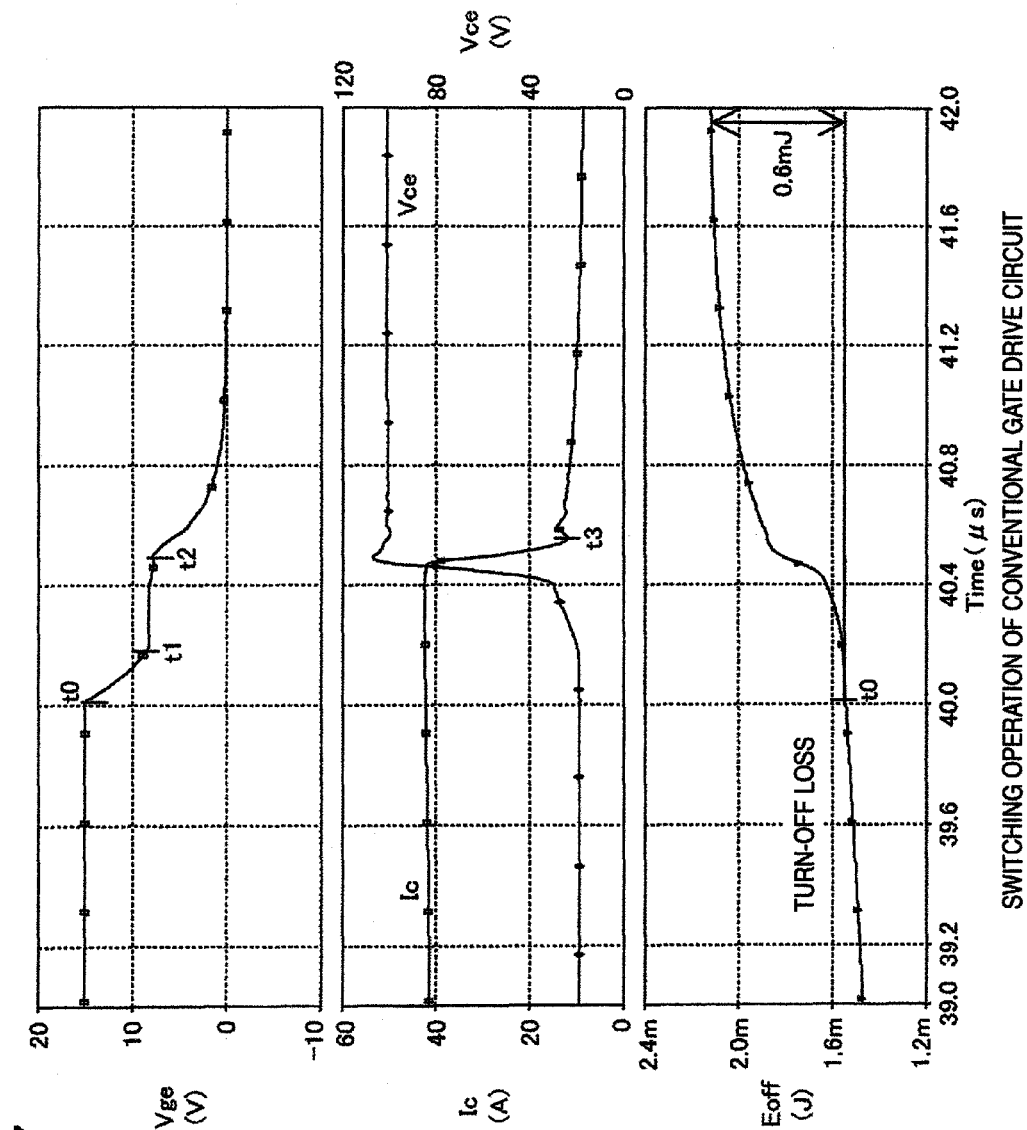
FIG. 7 shows operating waveforms observed in relation to the turn-off operations of an IGBT driven by a conventional gate drive circuit.

The switching operation of the IGBT 26 will now be described in detail with reference to FIGS. 7 and 8. FIG. 7 graphically shows the turn-off loss occurring in the switching operation of a conventional gate drive circuit which lacks a negative voltage generating circuit.

Figure 8:
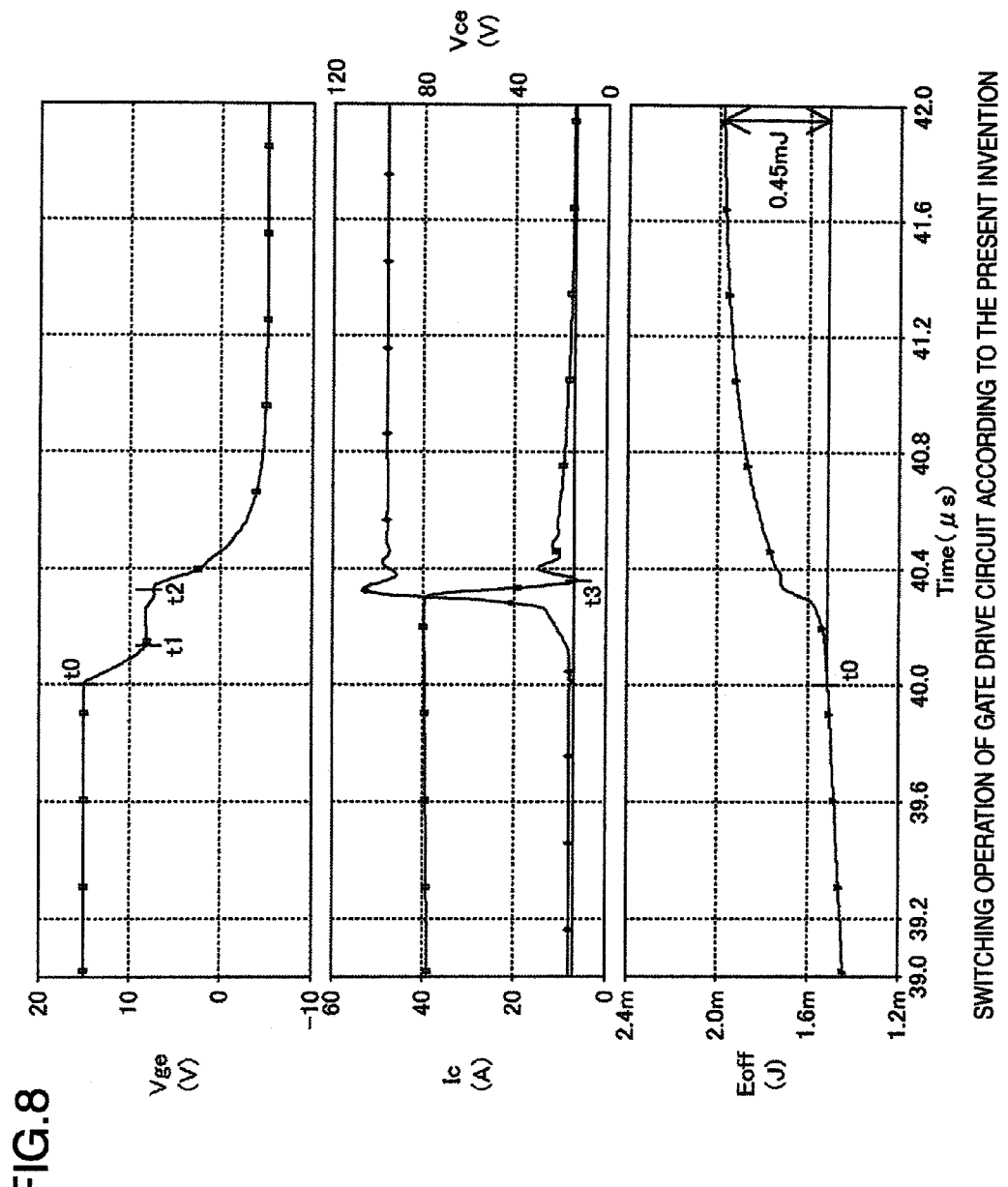
FIG. 8 shows operating waveforms observed in relation to the turn-off operations of an IGBT driven by a gate drive circuit according to the fifth embodiment of this invention.

FIG. 8 graphically shows the turn-off loss occurring in the switching operation of a gate drive circuit according to this invention which includes a negative voltage generating circuit 6.

In both FIGS. 7 and 8, the solid curves in the graphs from top to bottom represent the gate voltage Vge, the collector current Ic and the collector voltage Vce, of the IGBT 26, and the turn-off loss, respectively.

The switching operation of the conventional gate drive circuit will first be described with reference to FIG. 7. When a turn-off signal is applied to the IGBT 26 at time to, the gate-emitter capacitance Cge (input capacitance) is discharged until time t1. Consequently, the gate voltage decreases and the collector voltage Vce starts rising at time t1. At this time, a positive voltage is applied to the gate-side terminal of the gate-collector capacitance Ccg (feedback capacitance). When the collector voltage Vce exceeds the gate voltage, current flows from collector to gate via the feedback capacitor. Accordingly, the gate voltage Vge remains constant until time t2 when the feedback capacitance discharges, and the collector current Ic of the IGBT 26 continues to flow. After the feedback capacitance has discharged, the input capacitance discharges again so that the IGBT is turned off and that the collector current Ic of the IGBT is cut off. At this time, the collector voltage Vce rises due to the effect of the time-differential di/dt of the collector current and the collector-emitter capacitance Cce (output capacitance). And when the collector voltage Vce reaches the voltage across the smoothing capacitor 28, the collector current Ic continues to fall until time t3. The collector current after time t3 is called "tail current", which flows as a result of carriers accumulated in the IGBT 26 being released. When the tail current is exhausted, the IGBT 26 gets turned off.

Comparison will then be made between the waveforms in the switching operations performed by the gate drive circuits with and without the negative voltage generating circuit, with reference to FIGS. 7 and 8. In FIG. 7 showing the gate drive circuit without the negative voltage generating circuit, a gate voltage Vge in the range of 0~15V can be applied, whereas in FIG. 8 showing the gate drive circuit with the negative voltage generating circuit, a gate voltage Vge in the range of −5~15V can be applied. Since a negative voltage can be applied as the gate voltage Vge, the duration for which the gate voltage Vge changes from 15V to 0V in case of FIG. 8 can be shorter than the duration for which the gate voltage Vge changes from 15V to 0V in case of FIG. 7. Accordingly, the time until the collector current Ic is cut off in FIG. 8 can be shorter than the time until the collector current Ic is cut off in FIG. 7, and thus the turn-off loss can also be drastically decreased.

Figure 9:
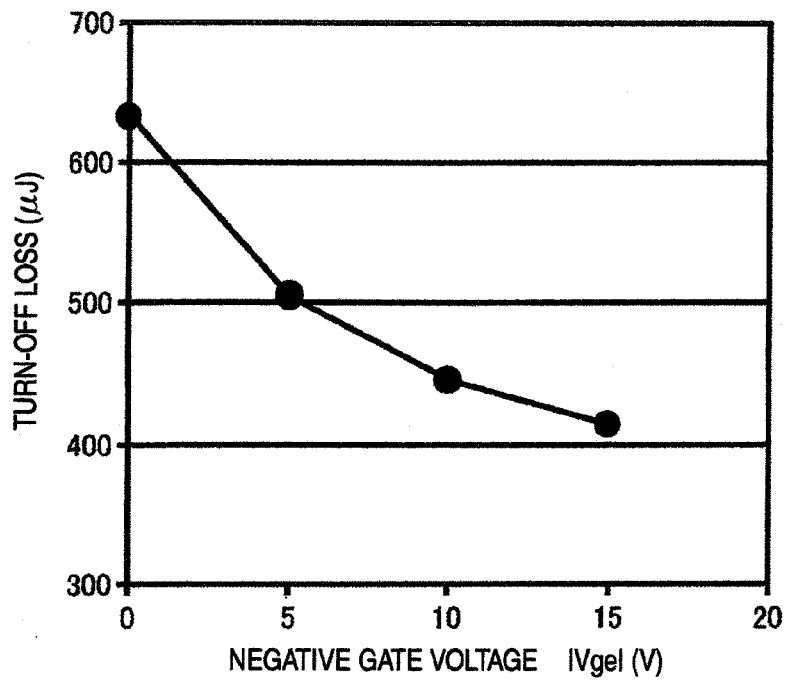
FIG. 9 graphically shows the dependence of the turn-off loss on the gate voltage, regarding the gate drive circuit as the fifth embodiment of this invention.
Figure 10:
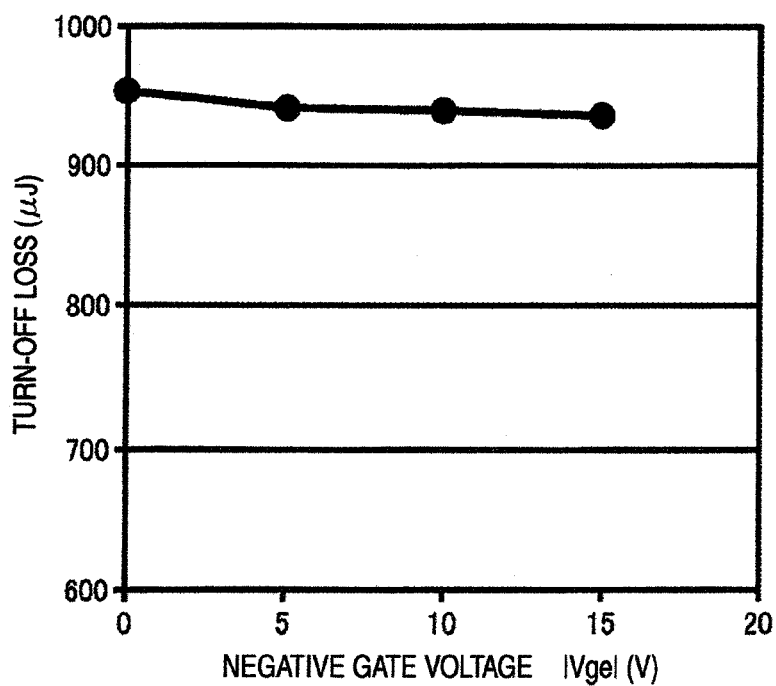
FIG. 10 graphically shows the dependence of the turn-on loss on the gate voltage, regarding the gate drive circuit as the fifth embodiment of this invention.

FIG. 9 shows the relationship between the negative voltage and the turn-off loss. As seen in FIG. 9, the increase in the absolute value of the negative voltage can decrease the turn-off loss. However, as seen also in FIG. 9, the rate of change in the turn-off loss decreases with the increase in the absolute value of the negative voltage. On the other hand, FIG. 10 shows a characteristic that the turn-off loss hardly changes with the increase in the absolute value of the negative voltage. Here, it is noted that the energy in the form of the negative voltage which drives the gate of the IGBT, is the energy accumulated in the capacitor 13. The energy E accumulated in the capacitor 13 is represented by the following expression (1).

$$E = \frac{1}{2} C \cdot Vc13^2 \qquad (1)$$

where E denotes the energy stored in the capacitor, C the capacitance of the capacitor, Vc13 the voltage across the capacitor.

It is apparent from the expression (1) that the energy E stored in the capacitor 13 is proportional to the square of the voltage developed across the capacitor 13. Let the capacitance C of the capacitor 13 be equal to 1 µF and let the energies stored in the capacitor 13, when the negative voltage takes values of −5V and −15V, be compared with each other. The stored energy is 12.5 µJ for −5V and 112.5 µJ for −15V. The latter is 9 times as large as the former. The greater is the stored energy, the larger is the required power capacity of the gate power source 1 which must supply the energy. Further, the resulting increase in the charging current increases the gate drive loss due to the resistance in the wiring conductor and the parasitic resistance (ESR) of the capacitor. Thus, the absolute value of the negative gate voltage should not be made too large so as to suppress the turn-off/turn-on loss and the gate drive loss.

As described above, if the gate drive circuit according to this invention is used, a negative voltage whose absolute value is smaller than the absolute value of the voltage of the gate power source can be applied between the gate and emitter of the IGBT so that the turn-on speed of the IGBT can be increased and that the turn-off loss can be reduced. This means that the performance of the converter can be improved.
[Modification 1 of Embodiment 5]

Figure 11:
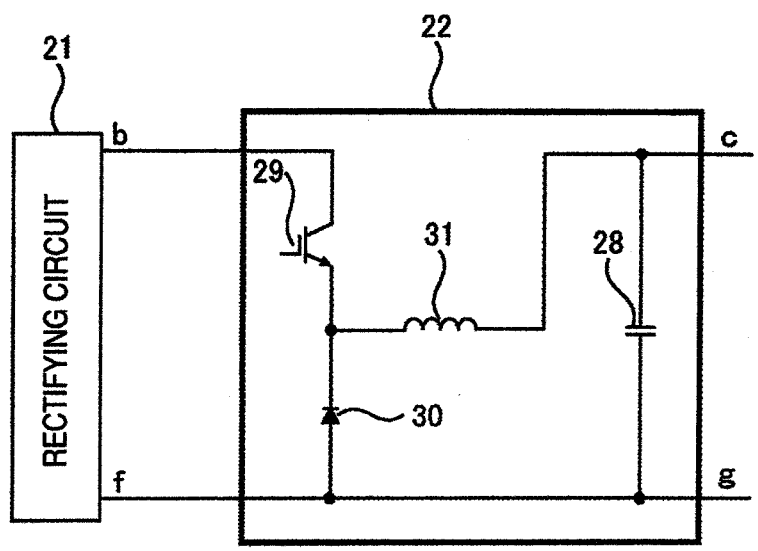
FIG. 11 shows the first modification of the converter used in the gate drive circuit as the fifth embodiment of this invention.

FIG. 11 shows the first modification of the fifth embodiment described above. FIG. 11 shows the circuit configuration of a converter 22. The converter 22 employs the configuration of a step-down chopper circuit which comprises a choke coil 3, an IGBT 29, a diode 30 and a smoothing capacitor 28.

Description is made of the structure of the circuit. The positive terminal b of the rectifying circuit 21 is connected with the collector terminal of the IGBT 29, and the cathode of the diode 30 is connected with the emitter terminal of the IGBT 29, which is in turn connected with the positive electrode of the smoothing capacitor 28 via the choke coil 31. The negative electrode of the smoothing capacitor 28 is connected with the anode of the diode 30 and the negative terminal f of the rectifying circuit 21.

Description is then made of the operation of this converter 22. When the IGBT 29 is turned on, current flows through a path consisting of the rectifying circuit 21, the IGBT 29, the choke coil 31 and the smoothing capacitor 28. Accordingly, electromagnetic energy is stored in the choke coil 31 and power is also transferred to the output terminal c. When the IGBT 29 is then turned off, the electromagnetic energy stored in the choke coil 31 is released through a path consisting of the choke coil 31, the smoothing capacitor 28 and diode 30, so that electric energy is store in the smoothing capacitor 28. By repeating this operation, the energy supplied from the commercial AC power source 20 is stored in the smoothing capacitor 28 and further transferred as energy having voltage lower than the input voltage, to an inverter connected at the stage after the smoothing capacitor 28 or a load (not shown).
[Modification 2 of Embodiment 5]

Figure 12:
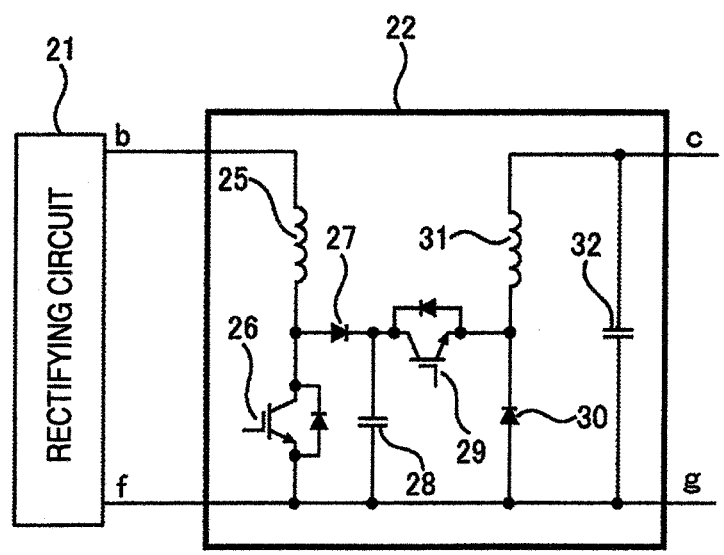
FIG. 12 shows the second modification of the converter used in the gate drive circuit as the fifth embodiment of this invention.

FIG. 12 shows the second modification of the fifth embodiment described above. FIG. 12 shows the circuit configuration of a converter 22. The converter 22 employs a step-up chopper circuit at the front stage and a step-down chopper circuit at the rear stage. Circuit components equivalent to those shown in FIG. 6 or 11 are designated by like reference numerals and their description is omitted.

Description is made of the structure of the circuit in FIG. 12. The positive terminal b of the rectifying circuit 21 is connected with the collector terminal of an IGBT 26 and the anode of a diode 27 via a choke coil 25. The emitter terminal of the IGBT 26 is connected with the negative terminal f of the rectifying circuit 21. The cathode of the diode 27 is connected with the positive electrode of the smoothing capacitor 28. The negative electrode of the smoothing capacitor 28 is connected with the negative terminal f of the rectifying circuit 21. In this way, a step-up chopper circuit is made up.

Further, the positive electrode of the smoothing capacitor 28 is connected with the collector terminal of the IGBT 29, and the emitter terminal of the IGBT 29 is connected with the cathode of the diode 30. Also, the emitter terminal of the IGBT 29 is connected with the positive electrode of an output capacitor 32 via the choke coil 31. The negative electrode of the output capacitor 32 is connected with the anode of the diode 30 and the negative electrode of the smoothing capacitor 28.

Description is then made of the operation of this converter 22. First, the step-up chopper circuit performs the PFC control described above with the fourth embodiment, shaping the input current into a sinusoidal wave and performing control for adjusting the voltage across the smoothing capacitor 28 to a fixed value. The step-down chopper circuit controls its output voltage and supplies power in accordance with the outputs of the inverter 23 and the load 24 connected therewith. The detailed descriptions of the operations of the step-up and step-down choppers are omitted since they are the same as those described above with the fifth embodiment and the first modification of the fifth embodiment.
[Modification 3 of Embodiment 5]

Figure 13:
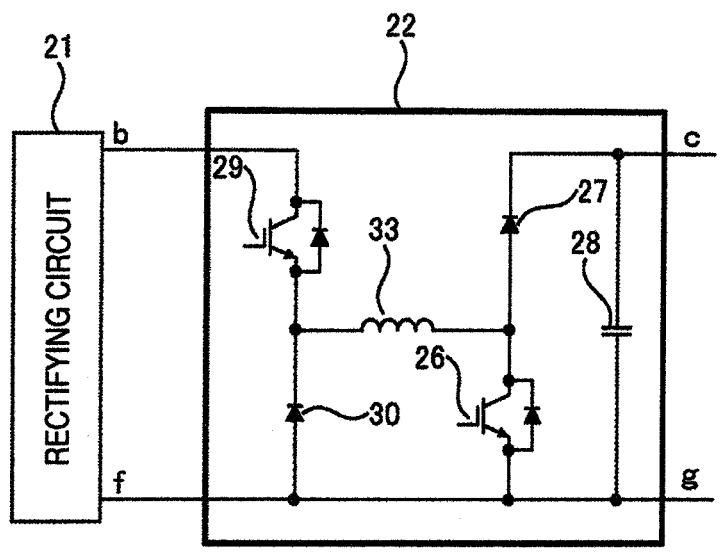
FIG. 13 shows the third modification of the converter used in the gate drive circuit as the fifth embodiment of this invention.

FIG. 13 shows the third modification of the fifth embodiment described above. FIG. 13 shows the circuit configuration of a converter 22. The converter 22 shown in FIG. 13 employs a step-down chopper circuit at the front stage and a step-up chopper circuit at the rear stage, and comprises a choke coil 33, IGBTs 26 and 29, diodes 27 and 30, and a smoothing capacitor 28.

Description is made of the structure of the circuit in FIG. 13. The positive terminal b of the rectifying circuit 21 is connected with the collector terminal of the IGBT 29, and the emitter terminal of the IGBT 29 is connected with the cathode of the diode 30. Also, the emitter terminal of the IGBT 29 is connected with the collector terminal of the IGBT 26 and the anode of the diode 27 via the choke coil 33. The emitter terminal of the IGBT 26 is connected with the negative terminal f of the rectifying circuit 21. The cathode of the diode 27 is connected with the positive electrode of the smoothing capacitor 28. The negative electrode of the smoothing capacitor 28 is connected with the negative terminal f of the rectifying circuit 21.

Description is then made of the operation of this converter 22. First, a step-down operation takes place if the output voltage is lower than the input voltage. When the IGBT 29 is turned on and the IGBT 26 is turned off, current flows through a path consisting of the rectifying circuit 21, the IGBT 29, the choke coil 33, the diode 27 and the smoothing capacitor 28 so that electromagnetic energy is stored in the choke coil 33 and also that electric power is transferred to the output terminal c. Then, if the IGBT 29 is turned off, the energy stored in the choke coil 33 is released through a path consisting of the choke coil 33, the diode 27, the smoothing capacitor 28 and diode 30 so that electrostatic energy is accumulated in the smoothing capacitor 28. By repeating this operation, the energy supplied from the commercial AC power source 20 is stored in the smoothing capacitor 28 and further transferred as energy having a voltage lower than the input voltage, to an inverter connected at the stage after the smoothing capacitor 28 and a load (not shown).

On the other hand, in the step-up operation, when the IGBT 29 remains turned on and the IGBT 26 is also turned on, current flows through a path consisting of the rectifying circuit 21, the IGBT 29, the choke coil 33 and the IGBT 26 so that electromagnetic energy is stored in the choke coil 33. Then, if the IGBT 26 is turned off, the energy stored in the choke coil 33 is released through a path consisting of the choke coil 33, the diode 27, the smoothing capacitor 28, the rectifying circuit 21 and the IGBT 29 so that electrostatic energy is accumulated in the smoothing capacitor 28. By repeating this operation, the energy supplied from the commercial AC power source (not shown) is stored in the smoothing capacitor 28; a voltage higher than the input voltage is outputted; and energy is transferred to an inverter connected at the stage after the smoothing capacitor 28 and a load (not shown).

In this modification of the fifth embodiment, the PFC control can be performed by selectively performing the step-down and step-up operations in accordance with the input voltage.

[Embodiment 6]

The sixth embodiment of this invention will be described with reference to FIG. 14.

Figure 14:
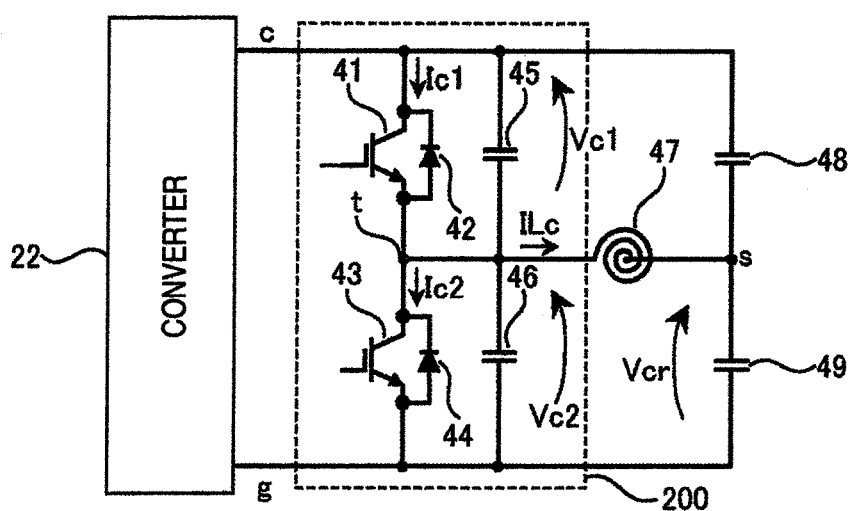
FIG. 14 is the circuit configuration of an inverter as the sixth embodiment of this invention.

FIG. 14 shows a circuit prepared for describing in detail the inverter 23 and the load 24 used in the preceding embodiments.

FIG. 14 shows the circuit configuration of an inverter 23 and a load 24 to be used in this sixth embodiment. The inverter 23 and the load 24 together are in the form of a half-bridge inverter used as an induction heating circuit. A series circuit of an IGBT 41 and an IGBT 43 is connected between the positive and negative terminals c and g of the converter 22. Let the junction point between the IGBTs 41 and 43 be named "point t". Then, a parallel circuit of a diode 42 and a snubber capacitor 45 is connected between the collector and emitter terminals of the IGBT 41, with the anode and cathode of the diode 42 connected respectively with the point t and the point c; and a parallel circuit of a diode 44 and a snubber capacitor 46 is connected between the collector and emitter terminals of the IGBT 43, with the anode and cathode of the diode 44 connected respectively with the point g and the point t. In this way, the upper and lower arms 200 of the inverter are constructed. Further, a series circuit of resonant capacitors 48 and 49 is connected between the points c and g. Let the junction point between the resonance capacitors 48 and 49 be named "point s". Then, a heating coil 47 is connected between the points t and s. It is to be noted here that as disclosed in the fourth embodiment described above, the output terminals of the converter 22 or the output terminals of the rectifying circuit 21 which rectifies the AC power supplied from the commercial AC power source 20 may be connected with the points c and g.

Figure 15:
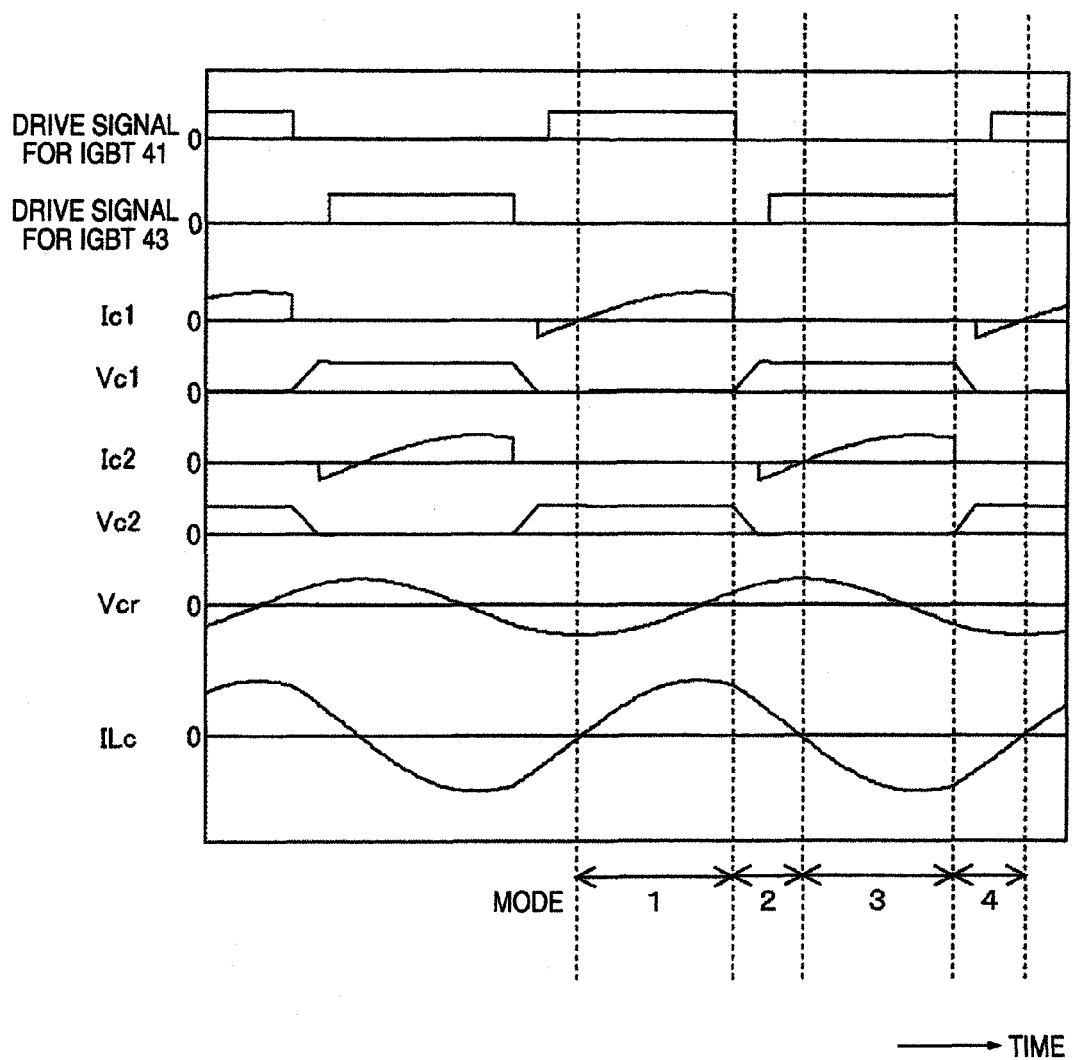
FIG. 15 shows operating waveforms observed in relation to the inverter as the sixth embodiment of this invention.

Next, the operation of the inverter will be described. FIG. 15 shows the waveforms appearing in the mode 1 through the mode 4 of the operation of the inverter according to this embodiment. It is to be noted here that in each mode the IGBTs 41 and 43 have a dead time period and operate on complementary basis.

As shown in FIG. 15, a sinusoidal coil current ILc flows through the heating coil 47. The resonance frequency fr for the current ILc is given by the following expression (2) involving the inductance L of the heating coil 47 and the synthesized electrostatic capacitance C of the parallel circuit of the resonance capacitors 48 and 49.

$$fr = \frac{1}{2\pi\sqrt{L \cdot C}} \quad (2)$$

The detailed description of the operations in mode 1 through mode 4 will be made below.

[Mode 1]

It is assumed that the mode 1 starts at the instant of time when the collector current Ic1 of the IGBT 41 vanishes, that is, becomes 0 A. At the beginning of the mode 1, although no current is flowing through the IGBT 41, the current Ic1 starts flowing through the IGBT 41 immediately after the beginning of the mode 1 since at this time the IGBT 41 has already been turned on. Since at this time the emitter-collector voltage Vc1 of the IGBT 41 is 0V, the IGBT 41 performs the so-called ZVZCS turn-on that accompanies zero power loss.

[Mode 2]

When the IGBT 41 is turned off and the mode 2 is entered, the current ILc flows through a path consisting of the converter 22, snubber capacitor 45, the heating coil 47 and the resonance capacitor 49; a path consisting of the heating coil 47, the resonance capacitor 48 and the snubber capacitor 45; and a path consisting of the snubber capacitor 46, the heating coil 47 and the resonance capacitor 49. In this case, the snubber capacitor 45 is charged and the snubber capacitor 46 is discharged. As a result, the emitter-collector voltage of the IGBT 41 rises slowly so that the ZVS turn-off takes place, thereby making the switching loss small.

When the voltage Vc1 across the snubber capacitor 45 exceeds the power source voltage (i.e. voltage between the terminals c and g), the voltage Vc2 across the snubber capacitor 46 is reduced to zero. Consequently, the diode 44 becomes conductive and the current ILc continues to flow through the heating coil 47. A turn-on signal is applied to the IGBT 43 while the diode 44 is drawing current.

[Mode 3]

It is assumed that the mode 3 starts at the instant of time when the collector current Ic2 of the IGBT 43 vanishes, that is, becomes 0 A. At the beginning of the mode 3, although no current is flowing through the IGBT 43, the current Ic2 starts flowing through the IGBT 43 immediately after the beginning of the mode 3 since at this time the IGBT 43 has already been turned on. Since at this time the emitter-collector voltage Vc2 of the IGBT 43 is 0V, the IGBT 43 performs the so-called ZVZCS turn-on that accompanies zero power loss.

[Mode 4]

When the IGBT 43 is turned off and the mode 4 is entered, the current ILc flows through a path consisting of the heating coil 47, the snubber capacitor 46, the converter 22 and the resonance capacitor 48; a path consisting of the heating coil 47, the snubber capacitor 46 and the resonance capacitor 49; and a path consisting of the snubber capacitor 45 resonance capacitor 48 and the heating coil 47. In this case, the snubber capacitor 46 is charged and the snubber capacitor 45 is discharged. As a result, the emitter-collector voltage of the IGBT 43 rises slowly so that the ZVS turn-off takes place, thereby making the switching loss small.

By repeating operations represented by the modes 1 through 4, that is, causing high frequency current to flow through the heating coil 47, the heating coil 47 generates magnetic flux. The magnetic flux in turn generates eddy currents in a pan placed over the heating coil so that the pan is heated due to the phenomenon of inductive heating.

Figure 16:
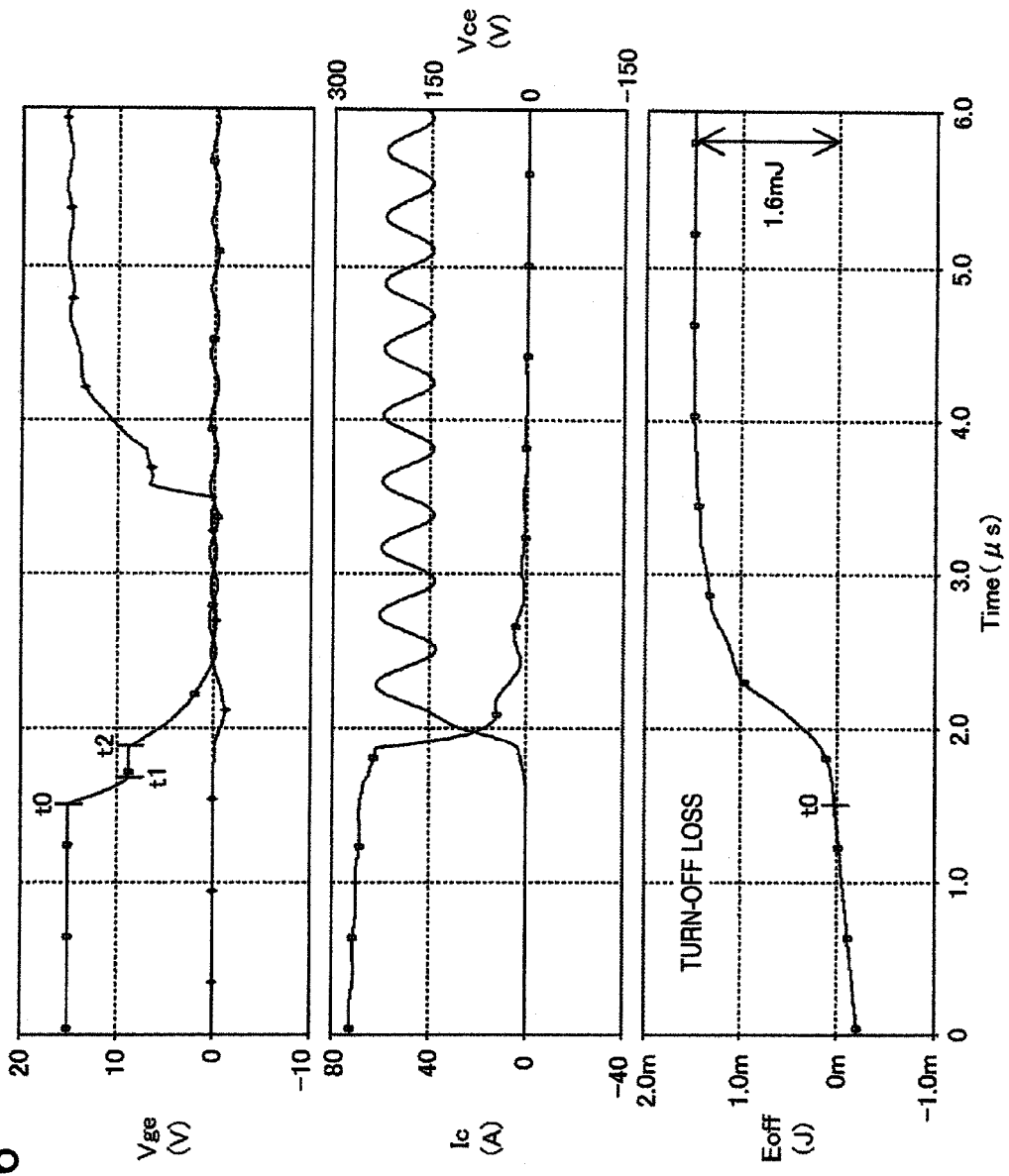
FIG. 16 shows operating waveforms observed in relation to the turn-off operations of an IGBT driven by a conventional gate drive circuit.
Figure 17:
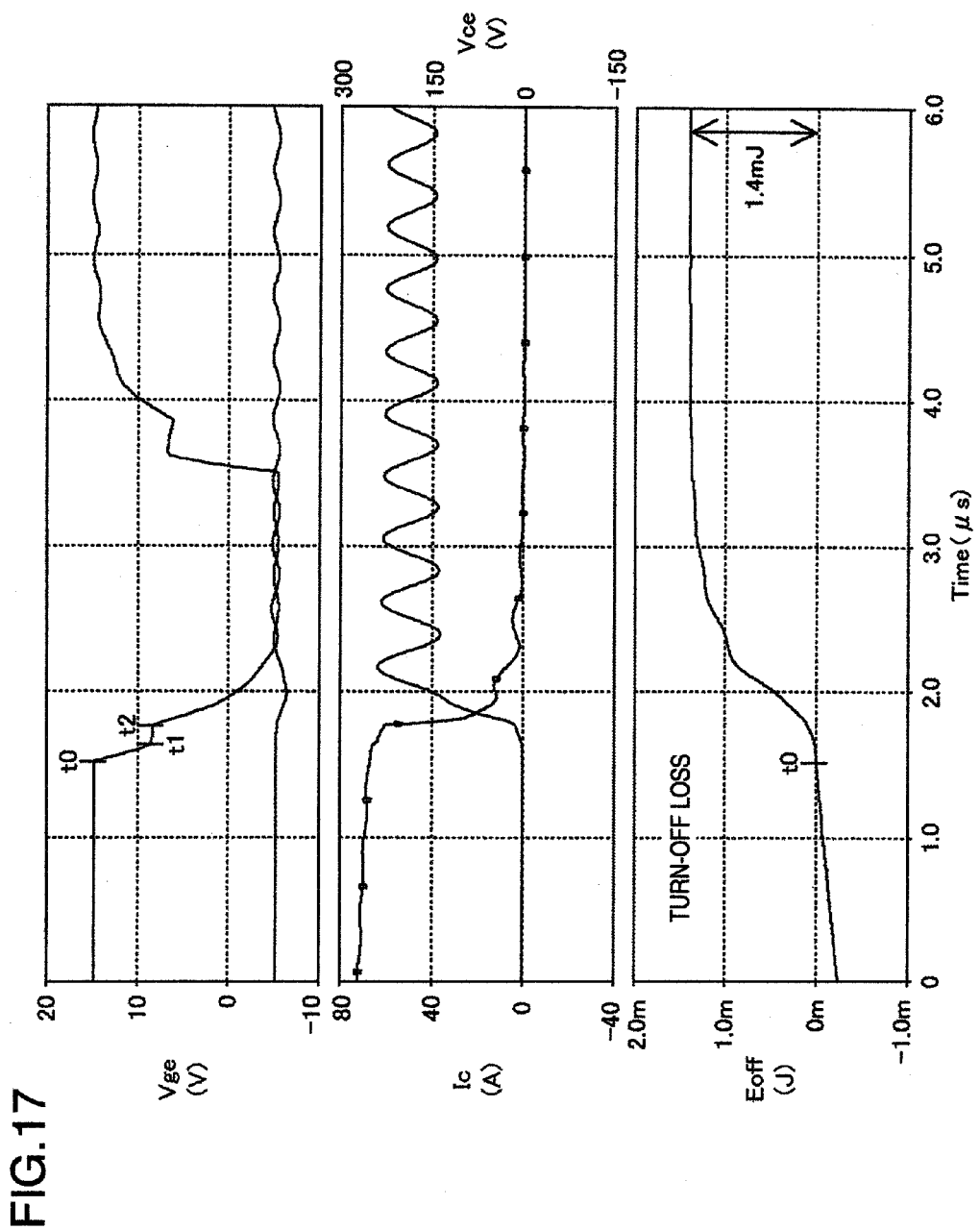
FIG. 17 shows operating waveforms observed in relation to the turn-off operations of an IGBT driven by a gate drive circuit according to the sixth embodiment of this invention.

FIGS. 16 and 17 show signal waveforms for explaining how turn-off takes place in the presence or absence of the negative gate voltage. As described above, since a resonance type inverter does not incur turn-on loss, loss is incurred only in the turn-off operation. FIG. 16 shows the waveforms for the operation without negative gate voltage, while FIG. 17 shows the waveforms for the operation with negative gate voltage. The operation mechanism at the time of turn-off is not described here as it is the same as that described above with the fifth embodiment.

It is understood that when a negative voltage is applied to the gate, the gate voltage shown in FIG. 17 falls faster than the gate voltage shown in FIG. 16. Accordingly, the collector current is also cut off rapidly so that the turn-off loss can be reduced. In this embodiment, too, the turn-off loss can be reduced without the application of a negative gate voltage higher than required, by using a gate drive circuit according to this invention. Thus, the heating efficiency of a cooking heater of inductive heating (IH) type.

[Modification 1 of Embodiment 6]

Figure 18:
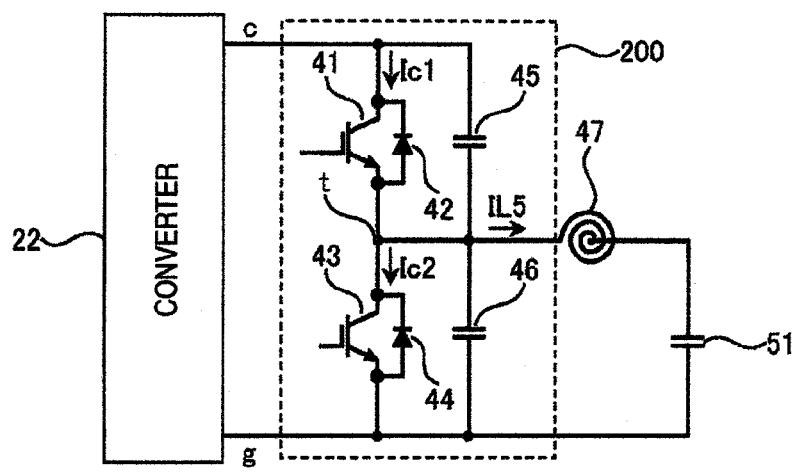
FIG. 18 is the first modification of the inverter as the sixth embodiment of this invention.

FIG. 18 shows an inverter and its load as the first modification of the sixth embodiment. This first modified embodiment lacks the resonance capacitor 48 used in the sixth embodiment described above, and takes on a resonance capacitor 51 in place of the resonance capacitor 49. The rest of the circuit shown in FIG. 18 is the same as the circuit of the sixth embodiment shown in FIG. 14, and the description is omitted. This inverter is of single ended push pull (SEPP) circuit configuration. The capacitance of the resonance capacitor 51 is set equal to the synthesized capacitance of the resonance capacitors 48 and 49 connected in series with each other. The description of the operations of this inverter and its load is omitted since they are the same as those described with the sixth embodiment.

[Modification 2 of Embodiment 6]

Figure 19:
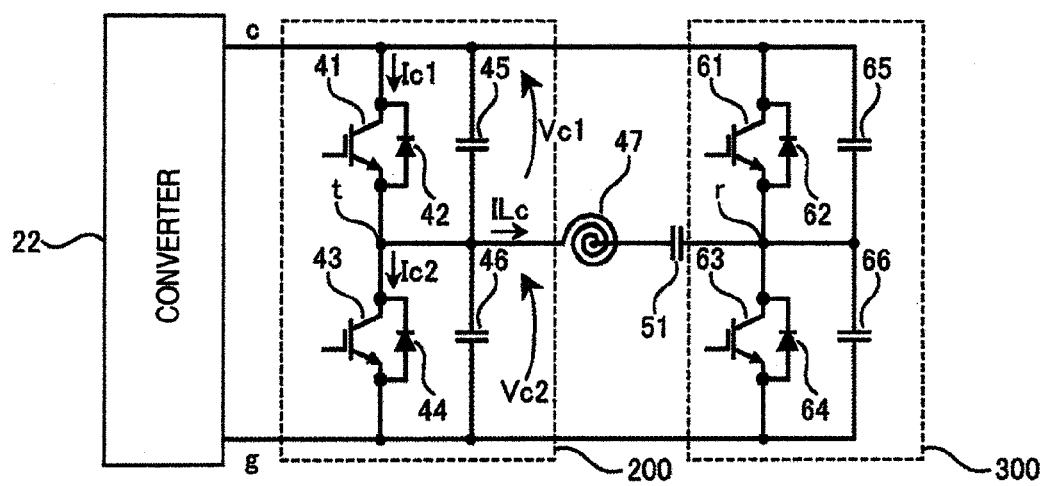
FIG. 19 is the second modification of the inverter as the sixth embodiment of this invention.

FIG. 19 shows an inverter and its load as the second modification of the sixth embodiment. This modification is of full-bridge inverter circuit configuration. In FIG. 19, circuit components equivalent to those shown in FIG. 14 are designated by the same reference numerals. Also, duplicated description will be avoided. The upper/lower arm 200 and upper/lower arm 300 of the full-bridge inverter are connected between the output terminals c and g, and a series circuit of the heating coil 47 and the resonance capacitor 51 is connected between the mid point t of the upper/lower arm 200 and the mid point r of the upper/lower arm 300. The IGBT 41 and 43, and IGBT 61 and 63 are provided respectively with the reverse-parallel diodes 42 and 44, and reverse-parallel diodes 62 and 64, with the collector terminals of the IGBTs connected with the cathodes of the diodes and the emitter terminals of the IGBTs connected with the anodes of the diodes. By applying the same drive signal to the gates of the IGBTs 41 and 63 and also by applying the same drive signal to the gates of the IGBTs 43 and 61, the IGBTs 41 and 43 operate in complementary manner while the IGBTs 61 and 63 operate in complementary manner.

As to the soft-switching operation of the IGBTs, description will be omitted since it is like what has been described with the half-bridge inverter under the foregoing captions. In this case of full-bridge inverter, the voltage applied across the series circuit of the heating coil 47 and the resonance capacitor 51, i.e. inverter output voltage (voltage between points t and r), is twice as high as the inverter output voltage of the half-bridge inverter. Accordingly, the number of the turns of the heating coil 47 can be increased so that heating efficiency can be improved.

[Modification 3 of Embodiment 6]

Figure 20:
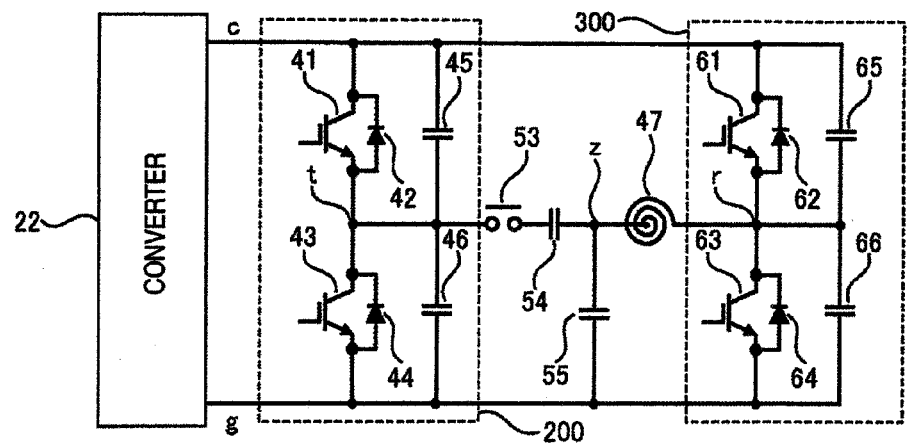
FIG. 20 is the third modification of the inverter as the sixth embodiment of this invention.

FIG. 20 shows an inverter circuit with its load, as the third modification of the sixth embodiment. This modified embodiment uses a relay 53 for changing over between the single ended push pull (SEPP) circuit configuration and the full-bridge inverter circuit. Regarding inductive heating, if the types of inverters are changed depending on the types of loads to be heated, not only load of magnetic metal such as iron or magnetic stainless steel but also load of non-magnetic metal such as aluminum or copper can be heated. Non-magnetic material such as aluminum or copper that has a low electric resistivity is heated by the SEPP inverter. On the other hand, magnetic material such as iron or magnetic stainless steel that has a high electric resistivity is heated by the full-bridge inverter which can generate a high voltage due to the resonance circuit consisting of the heating coil and the resonance capacitor. By opening the contacts of the relay 53, the SEPP inverter is brought into action while the full-bridge inverter takes over the SEPP inverter by closing the contacts of the relay 53. The description of the operations of the SEPP inverter and the full-bridge inverter will be omitted since it is the same as with the modifications 1 and 2 of the sixth embodiment.

[Embodiment 7]

The seventh embodiment of this invention will be described with reference to FIG. 21.

Figure 21:
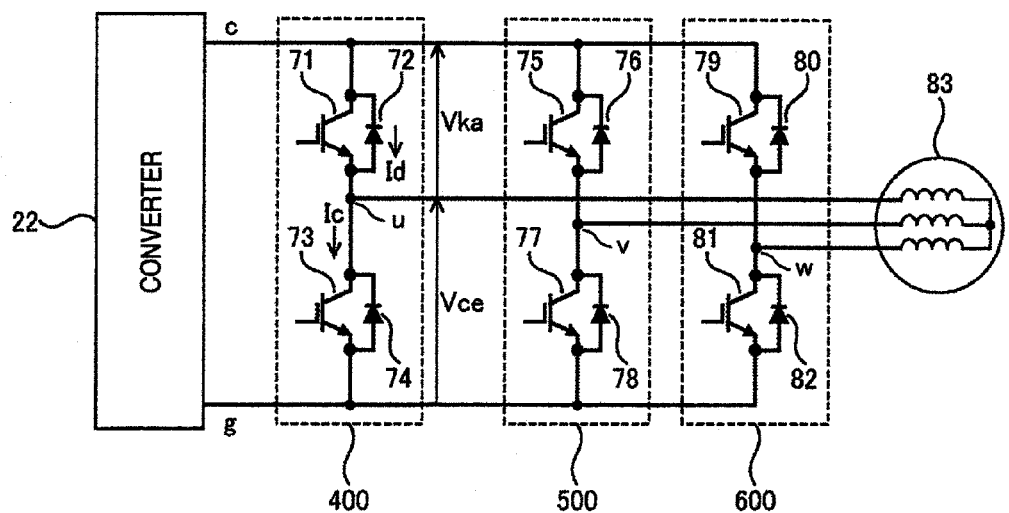
FIG. 21 is the circuit configuration of an inverter as the seventh embodiment of this invention.

FIG. 21 is used to concretely explain the inverter 23 and the load 24 used in the foregoing embodiments.

FIG. 21 shows the circuit diagram of the inverter 23 and the load 24 used in the foregoing embodiments. The inverter 23 of this embodiment is a three-phase full-bridge inverter circuit for use as a motor inverter. Between the output terminals c and g of the converter 22 are connected the U-phase, V-phase and W-phase branches of the three-phase full-bridge inverter. The U-phase branch comprises a series circuit of an IGBT 71 with a reverse-parallel diode 72 connected between its emitter and collector and an IGBT 73 with a reverse-parallel diode 74 connected between its emitter and collector; the diode 72 having its cathode and anode connected respectively with terminal c and the point u, i.e. junction point between the IGBTs 71 and 73, and the diode 74 having its anode and cathode connected respectively with the terminal g and the point u. The V-phase branch comprises a series circuit of an IGBT 75 with a reverse-parallel diode 76 connected between its emitter and collector and an IGBT 77 with a reverse-parallel diode 78 connected between its emitter and collector; the diode 76 having its cathode and anode connected respectively with terminal c and the point v, i.e. junction point between the IGBTs 75 and 77, and the diode 78 having its anode and cathode connected respectively with the terminal g and the point v. The W-phase branch comprises a series circuit of an IGBT 79 with a reverse-parallel diode 80 connected between its emitter and collector and an IGBT 81 with a reverse-parallel diode 82 connected between its emitter and collector; the diode 80 having its cathode and anode connected respectively with terminal c and the point w, i.e. junction point between the IGBTs 79 and 81, and the diode 82 having its anode and cathode connected respectively with the terminal g and the point w. A three-phase motor 83 is connected with the output terminals of the three-phase inverter, i.e. points u, v and w.

Figure 22:
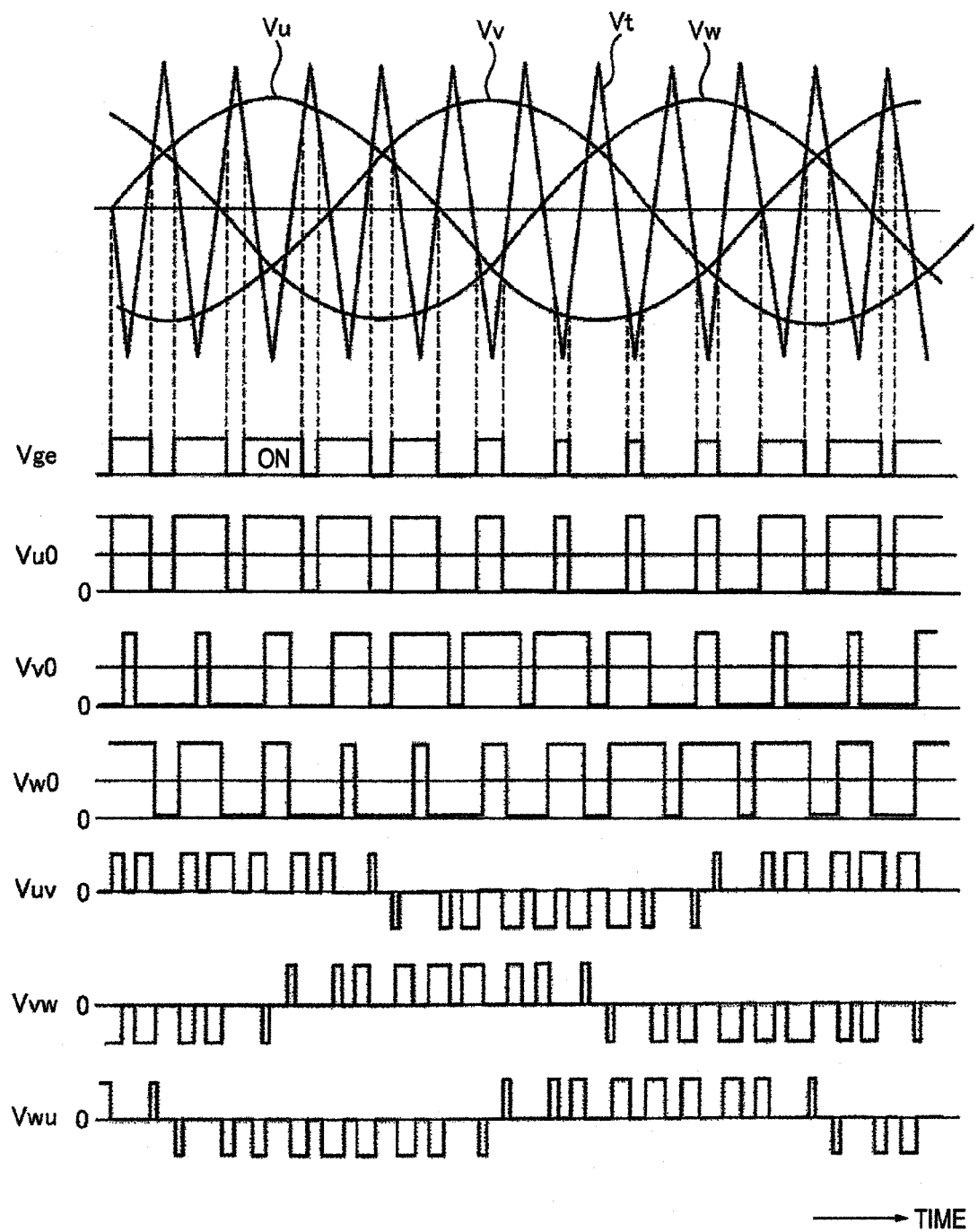
FIG. 22 illustrates a method of controlling an inverter used in the seventh embodiment of this invention and the waveforms relating to the operation of the inverter.
Figure 23:
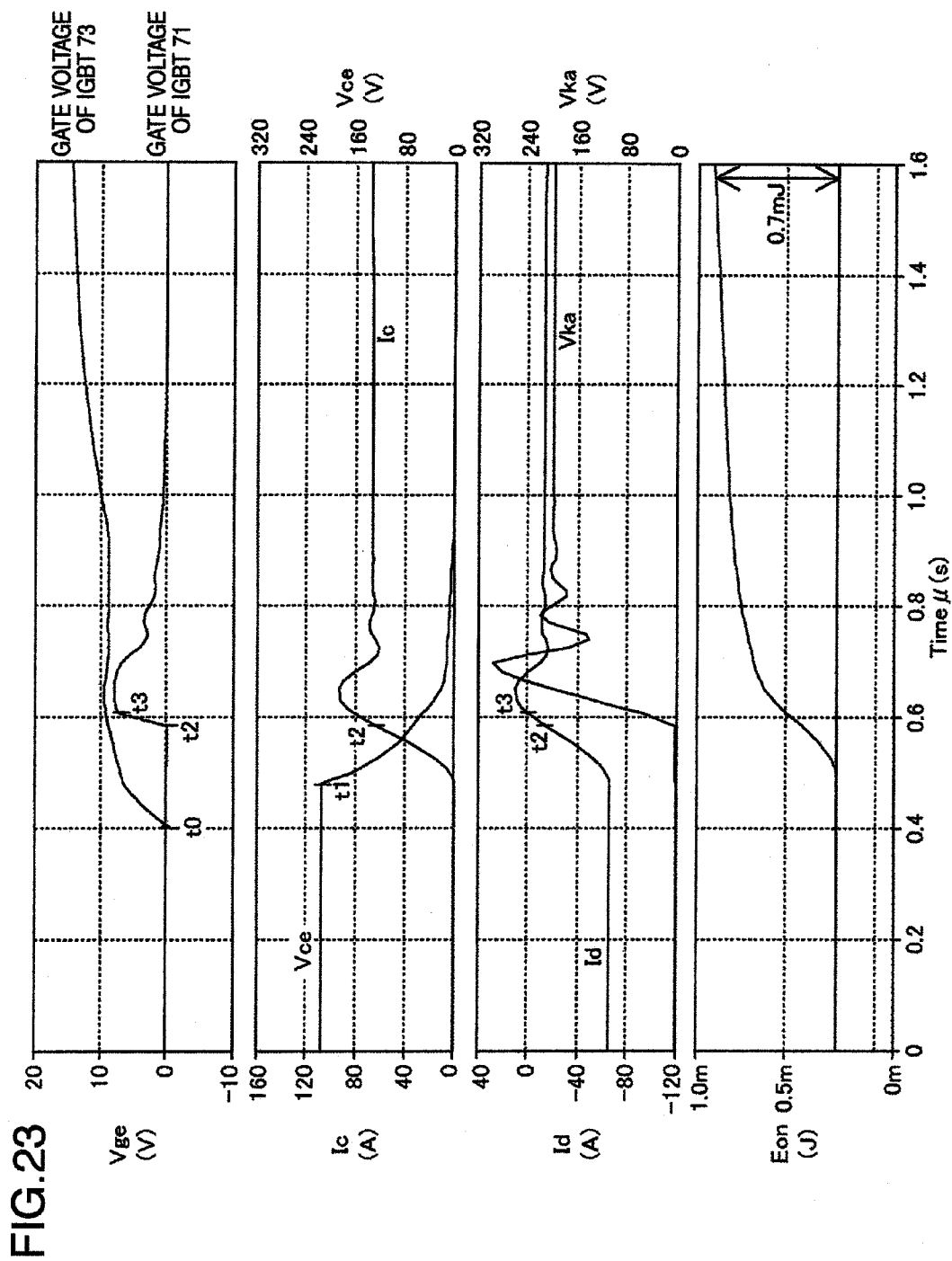
FIG. 23 shows operating waveforms observed in relation to the turn-off operations of an IGBT driven by a conventional gate drive circuit.
Figure 24:
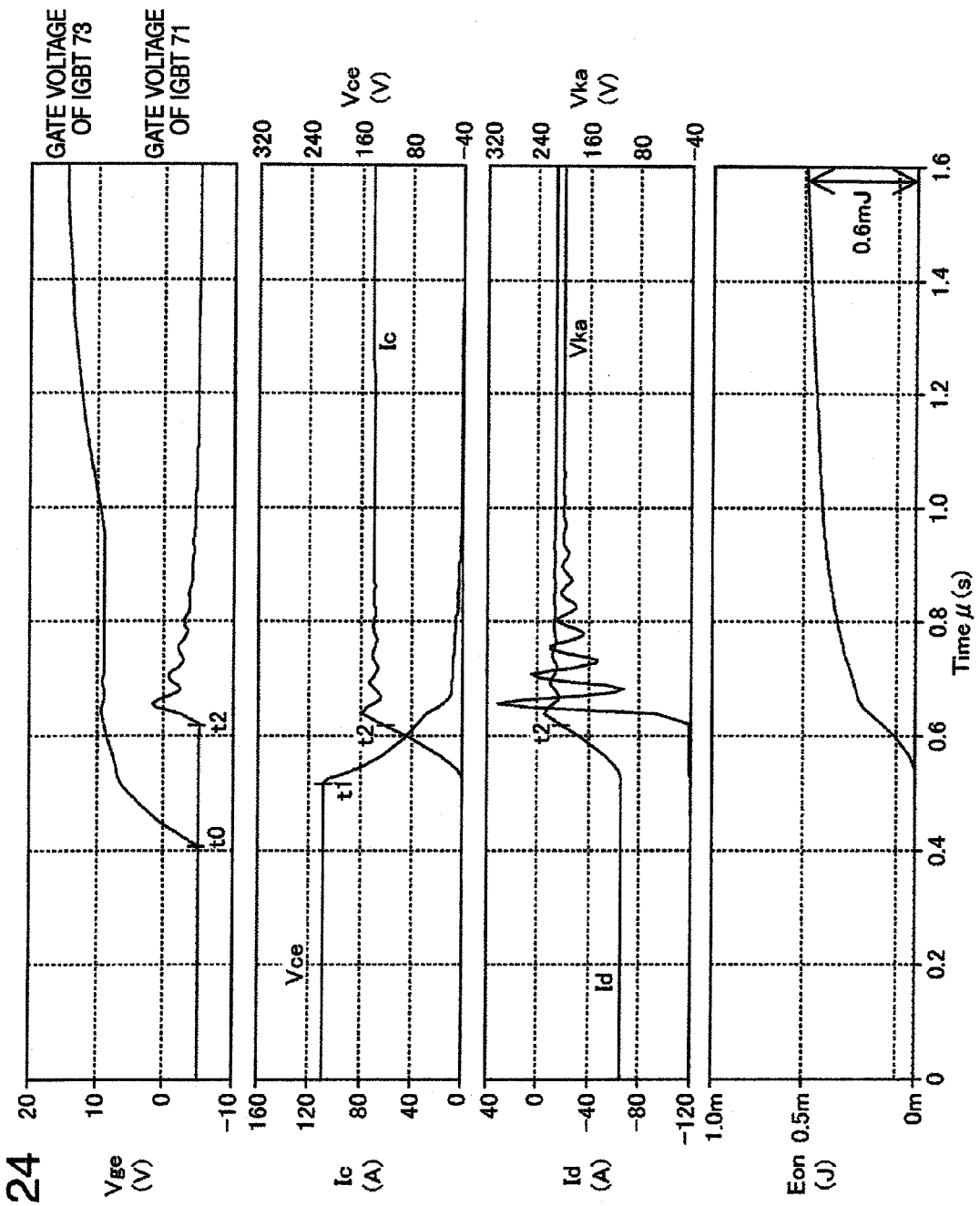
FIG. 24 shows operating waveforms observed in relation to the turn-off operations of an IGBT driven by a gate drive circuit according to the seventh embodiment of this invention.

Now, description will be made of the operation of the three-phase bridge inverter shown in FIG. 21. FIG. 22 shows the waveforms useful in understanding the operation of the three-phase bridge inverter. With a three-phase full-bridge inverter, high-frequency square-wave outputs whose averages are proportional to the amplitudes of the voltage command signals can be obtained by controlling the conduction and cutoff of the IGBTs in response to the switching signals generated as a result of the comparison of the triangular carrier signal with the voltage command signals. Therefore, if the voltage command signals are changed in a sinusoidal manner, AC output voltages can be obtained. As shown in FIG. 22, at time instants when the amplitudes of the sinusoidal voltage command signals of the respective phases Uu, Vv and Ww becomes equal to the amplitude of the triangular wave signal Vt, two IGBTs of the corresponding phases are turned on or off. It is to be noted here that regarding the two IGBTs of the same phase, while one is conducting, the other is cut off so that short circuiting in the power source can be avoided. The output voltages of the respective phases are denoted by Vuv, Vvw and Vwu. When these inter-phase voltages are applied to the respective phase windings of the motor, the motor is driven to rotate. FIGS. 23 and 24 show operating waveforms generated when the IGBTs are switched with and without a negative voltage generating circuit. FIG. 23 corresponds to the case where the negative voltage generating circuit is not used, and FIG. 24 corresponds to the case where the negative voltage generating circuit is used. In FIGS. 23 and 24 are shown from top to bottom the waveforms of the gate voltages of the IGBTs 73 and 71, the collector voltage Vice and the collector current Ic of the IGBT 73, the cathode voltage Vka of and the current Id through the diode 72, and the turn-on loss Eon of the IGBT 73. The operation is as follows. As seen in FIG. 23, when the IGBT 73 is turned on at time t0, the collector voltage decreases at t1. Also, the forward current through the diode 72 decreases with the increase in the collector current of the IGBT 73. At time t2, a through current flows through the U-phase winding due to the recovery current of the diode 72. Consequently, the gate voltage of the IGBT 71 rises and when it exceeds a threshold value, the IGBT 71 fires erroneously. On the other hand, as seen from FIG. 24, since the gate voltage of the IGBT 73 is kept negative, the recovery current of the diode 72 is suppressed to reduce the increment of the gate voltage. Thus, the IGBT 73 can be prevented from being erroneously fired so that the turn-on loss of the IGBT 73 can be reduced. As described hitherto, by using the gate drive circuit according to this invention, the combination of a single power source and associated simple circuit configuration can generate a required negative gate voltage so that the motor inverter can be prevented from being erroneously fired and that the turn-on loss of the inverter can be reduced.

In the foregoing embodiments and their modifications, IGBTs are used as voltage-driven type semiconductor elements. However, the effect of this invention will remain valid even if the IGBTs are replaced by power MOSFETs suitable for high-frequency drive, or MOSFETs as wide band-gap elements that can operate at extremely high temperatures, or JFETs.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A gate drive circuit for driving a voltage-driven semiconductor element used in a power converter, comprising:
   a gate power source;
   a push-pull circuit including an NPN transistor and a first PNP transistor connected in series;
   a diode connected in series with the push-pull circuit between positive and negative electrodes of the gate power source;
   a negative voltage generating circuit connected between the positive electrode of the gate power source and a connecting point of the push-pull circuit and the diode; and
   a second PNP transistor connected between an output terminal of the negative voltage generating circuit and the negative electrode of the gate power source,
   wherein a junction point of the NPN transistor and the first PNP transistor is connected with a gate terminal of the voltage-driven semiconductor element via a gate resistor; and an emitter terminal of the voltage-driven semiconductor element is connected with the negative electrode of the gate power source.

2. The gate drive circuit according to claim 1, wherein the negative voltage generating circuit comprises a series circuit of two resistors, and a capacitor.

3. The gate drive circuit according to claim 1, wherein the negative voltage generating circuit comprises a series circuit of a zener diode and a resistor, and a capacitor.

4. The gate drive circuit according to claim 1, wherein MOSFETs are used in place of the NPN and PNP transistors.

5. The gate drive circuit according to claim 1, wherein the negative voltage generating circuit is configured to cause a negative voltage to be applied between the gate and emitter terminals of the voltage-driven semiconductor element to discharge gate capacitance of the voltage-driven semiconductor element.

6. A power converting apparatus comprising:
   an AC power source;
   a rectifying circuit for rectifying an output of the AC power source;
   a converter for converting an output of the rectifying circuit to DC voltage;
   a first gate drive circuit for driving the converter;
   an inverter for inverting an output of the converter to AC voltage;
   a second gate drive circuit for driving the inverter; and
   a load for receiving an output of the inverter,
   wherein each of the first and second gate drive circuits comprises:
   a gate power source;
   a push-pull circuit including an NPN transistor and a first PNP transistor connected in series;
   a diode connected in series with the push-pull circuit between positive and negative electrodes of the gate power source;
   a negative voltage generating circuit connected between the positive electrode of the gate power source and a connecting point of the push-pull circuit and the diode; and
   a second PNP transistor connected between an output terminal of the negative voltage generating circuit and the negative electrode of the gate power source,
   wherein a junction point of the NPN transistor and the first PNP transistor of the first gate drive circuit is connected with a gate terminal of a first voltage-driven semiconductor element in the converter, via a gate resistor; and an emitter terminal of the voltage-driven semiconductor element is connected with the negative electrode of the gate power source, and wherein a junction point of the NPN transistor and the first PNP transistor of the second gate drive circuit is connected with a gate terminal of a second voltage-driven semiconductor element in the inverter via a gate resistor; and an emitter terminal of the voltage-driven semiconductor element is connected with the negative electrode of the gate power source.

7. The power converting apparatus according to claim 6, wherein the converter comprises:
   a series circuit of a choke coil and a switching element, which comprises the first voltage-driven semiconductor element, connected in parallel with the rectifying circuit; and
   a series circuit of a diode and a capacitor, connected in parallel with the switching element,
   wherein the first gate drive circuit is configured for driving the switching element.

8. The power converting apparatus according to claim 6, wherein the converter comprises:
   a series circuit of a switching element, which comprises the first voltage-driven semiconductor element, and a diode, connected in parallel with the rectifying circuit; and
   a series circuit of a choke coil and a capacitor, connected in parallel with the diode,
   wherein the first gate drive circuit is configured for driving the switching element.

9. The power converting apparatus according to claim 6, wherein the converter comprises:
   a series circuit of a first choke coil and a first switching element, which comprises the first voltage-driven semiconductor element, connected in parallel with the rectifying circuit;
   a series circuit of a first diode and a first capacitor, connected in parallel with the first switching element;
   a series circuit of a second switching element and a second diode, connected in parallel with the first capacitor; and
   a series circuit of a second choke coil and a second capacitor, connected in series with the second diode,
   wherein the first gate drive circuit is configured for driving the first and second switching elements.

10. The power converting apparatus according to claim 6, wherein the converter comprises:
    a series circuit of a second switching element, which comprises the first voltage-driven semiconductor element, and a second diode, connected in parallel with the rectifying circuit;
    a series circuit of a choke coil and a first switching element, connected in parallel with the second diode; and
    a series circuit of a first diode and a capacitor, connected in parallel with the first switching element,
    wherein the first gate drive circuit is configured for driving the first and second switching elements.

11. The power converting apparatus according to claim 6, wherein the inverter comprises:
    a series circuit of a first switching element, which comprises the second voltage-driven semiconductor element, and a second switching element, connected in parallel with the rectifying circuit or the converter;
    a series circuit of a first resonance capacitor and a second resonance capacitor, connected in parallel with the rectifying circuit or the converter;
    a first diode connected in parallel with the first switching element, and a second diode connected in parallel with the second switching element;
    a first snubber capacitor connected in parallel with the first switching element, and a second snubber capacitor connected in parallel with the second switching element; and
    a heating coil as the load for inductive heating, which is connected between the junction point of the first and second switching elements and the junction point of the first and second resonance capacitor,
    wherein the second gate drive circuit is configured for driving the first and second switching elements.

12. The power converting apparatus according to claim 6, wherein the inverter comprises:
    a series circuit of a first switching element, which comprises the second voltage-driven semiconductor element, and a second switching element, connected in parallel with the rectifying circuit or the converter;
    a first diode connected in parallel with the first switching element, and a second diode connected in parallel with the second switching element;
    a first snubber capacitor connected in parallel with the first switching element, and a second snubber capacitor connected in parallel with the second switching element; and
    a series circuit of a heating coil as the load for inductive heating and a resonance capacitor, connected in parallel with the second switching element;
    wherein the second gate drive circuit is configured for driving the first and second switching elements.

13. The power converting apparatus according to claim 6, wherein the inverter comprises:
    a series circuit of a first switching element, which comprises the second voltage-driven semiconductor element, and a second switching element, connected in parallel with the rectifying circuit or the converter;
    a series circuit of a third switching element and a fourth switching element, connected in parallel with the rectifying circuit or the converter;
    a first diode, a second diode, a third diode and a fourth diode connected in parallel with the first, second, third and fourth switching elements, respectively;
    a first snubber capacitor, a second snubber capacitor, a third snubber capacitor and a fourth snubber capacitor connected in parallel with the first, second, third and fourth switching elements, respectively; and
    a series circuit of a heating coil as the load for inductive heating and a resonance capacitor, connected between the junction point of the first and second switching elements and the junction point of the third and fourth switching elements,
    wherein the second gate drive circuit is configured for driving the first, second, third and fourth switching elements.

14. The power converting apparatus according to claim 6, wherein the inverter comprises:
    a series circuit of a first switching element, which comprises the second voltage-driven semiconductor element, and a second switching element, connected in parallel with the rectifying circuit or the converter;
    a series circuit of a third switching element and a fourth switching element, connected in parallel with the rectifying circuit or the converter;
    a first diode, a second diode, a third diode and a fourth diode connected in parallel with the first, second, third and fourth switching elements, respectively;

a first snubber capacitor, a second snubber capacitor, a third snubber capacitor and a fourth snubber capacitor connected in parallel with the first, second, third and fourth switching elements, respectively;

a series circuit of a heating coil as the load for inductive heating and a first resonance capacitor, connected between the junction point of the first and second switching elements and the junction point of the third and fourth switching elements; and a second resonance capacitor connected between the junction point of the heating coil and the first resonance capacitor and the negative terminal of the rectifying circuit or the converter;

wherein the second gate drive circuit is configured for driving the first, second, third and fourth switching elements.

15. The power converting apparatus according to claim 6, wherein the inverter comprises:

a series circuit of a first switching element, which comprises the second voltage-driven semiconductor element, and a second switching element, connected in parallel with the rectifying circuit or the converter;

a series circuit of a third switching element and a fourth switching element, connected in parallel with the rectifying circuit or the converter;

a series circuit of a fifth switching element and a sixth switching element, connected in parallel with the rectifying circuit or the converter;

a first diode, a second diode, a third diode, a fourth diode, a fifth diode and a sixth diode connected in parallel with the first, second, third, fourth, fifth and sixth switching elements, respectively; and a motor as the load connected with the junction point of the first and second switching elements, the junction point of the third and fourth switching elements and the junction point of the fifth and sixth switching elements;

wherein the second gate drive, circuit is configured for driving the first, second, third, fourth, fifth and sixth switching elements.

16. The power converting apparatus according to claim 6, wherein the negative voltage generating circuit of the first gate drive circuit is configured to cause a negative voltage to be applied between the gate and emitter terminals of the first voltage driven element in the converter to discharge gate capacitance of the first voltage-driven semiconductor element and wherein the negative voltage generating circuit of the second gate drive circuit is configured to cause a negative voltage to be applied between the gate and emitter terminals of the second voltage-driven semiconductor element in the inverter to discharge the gate capacitance of the second voltage driven semiconductor element.

17. The power converting apparatus according to claim 6, wherein MOSFETs are used in place of the NPN and PNP transistors.

* * * * *